(12) United States Patent
Yoon et al.

(10) Patent No.: US 6,735,113 B2
(45) Date of Patent: May 11, 2004

(54) CIRCUIT AND METHOD FOR IMPLEMENTING A WRITE OPERATION WITH TCCT-BASED MEMORY CELLS

(75) Inventors: Sei-Seung Yoon, Cupertino, CA (US); Seong-Ook Jung, Cupertino, CA (US)

(73) Assignee: T-Ram, Inc., San Jose, CA (US)

( * ) Notice: Subject to any disclaimer, the term of this patent is extended or adjusted under 35 U.S.C. 154(b) by 25 days.

(21) Appl. No.: 10/272,360

(22) Filed: Oct. 15, 2002

(65) Prior Publication Data

US 2004/0071013 A1 Apr. 15, 2004

(51) Int. Cl.[7] .................................................. G11C 11/34
(52) U.S. Cl. ........................................ 365/174; 365/159
(58) Field of Search .................................. 365/174, 159; 257/133, 147, 155

(56) References Cited

U.S. PATENT DOCUMENTS

| | | | | |
|---|---|---|---|---|
| 5,883,829 A | * | 3/1999 | van der Wagt | 365/159 |
| 6,229,161 B1 | * | 5/2001 | Nemati et al. | 257/133 |
| 6,448,586 B1 | * | 9/2002 | Nemati et al. | 257/133 |
| 6,611,452 B1 | * | 8/2003 | Han | 365/159 |

* cited by examiner

*Primary Examiner*—Tan T. Nguyen

(57) ABSTRACT

The present invention provides a circuit and a method for providing nondestructive write operations and optimized memory access operations with reduced power consumption during memory access, such as during write operations. In one embodiment, a memory device comprises a memory cell configured to store a first data bit. The memory device also comprises a write access circuit coupled to the memory cell for providing a write data bit having a write data bit magnitude. The write access circuit is configured to adjust the write data bit magnitude to an intermediate logic state magnitude in a memory operation.

64 Claims, 10 Drawing Sheets

CIRCUIT AND METHOD FOR IMPLEMENTING A WRITE OPERATION WITH TCCT-BASED MEMORY CELLS

CROSS-REFERENCE TO RELATED APPLICATIONS

This application is related to U.S. patent application Ser. No. 10/191,686, entitled "Bit Line Control and Sense Amplification for TCCT-Based Memory Cells," filed on Jul. 5, 2002, which is hereby incorporated by reference in its entirety for all purposes.

BACKGROUND

1. Field of the Invention

The present invention relates generally to integrated circuits, and in particular, to a circuit and a method for performing write operations with thinly capacitively-coupled thyristor ("TCCT")-based memory cells.

2. Description of Related Art

The rate at which data must be processed is ever increasing in computing-related applications. For example, burgeoning computer graphic applications require faster execution of underlying computational processes to render enhanced three-dimensional images, especially when motion is added. As another example, data network applications demand enhanced computational processes in routing increasing amounts of data (using network elements, such as routers) over decreasing amounts of network bandwidth. The rate at which underlying computational processes are executed depends on the combined functionality of a main processing component, such as a central processing unit ("CPU") and/or a peripheral device (e.g., graphics processor) and, associated memory. Memory includes both data memory, such as cache (e.g., Static Random Access Memory, or "SRAM") and main memory (e.g., Synchronous Dynamic Random Access Memory, or "SDRAM"). Data processing rates, however, are generally limited by the manner in which data is exchanged between the processing and memory components, and by the use of conventional memory technology.

Traditionally, the exchange of data between the processing and memory components have been provided by "read" and "write" operations. Access between these components can be either for retrieving data or for programming data into memory cells. These operations, however, can hinder computational processing speeds because processor logic is generally faster than memory access time. That is, processing speed is generally limited by the speed at which data can be stored and retrieved from memory. For example, if a processor initiates a traditional read operation during a pending write operation, then it must postpone retrieving data for processing until the write operation has finished.

To improve memory access time, optimized memory access operations have been developed to coordinate memory access so as to optimize overall processing speed. A conventional approach to performing an optimized memory access is the "read-over-write" operation. In accordance with read-over-write operations, read operations are scheduled to take precedence over write operations, such that initiating a read will interrupt a pending write operation. Consequently, a memory request for stored data is serviced before data is written into memory, thus permitting continued data processing while the write operation is temporarily bypassed. After the read operation is complete, the bypassed write operation can resume.

To overcome the deficiencies of conventional memory technologies, emerging memory technologies have been developed to improve memory access times and operational speed, as well as to minimize power consumption. One such emerging technology relates to negative differential resistance ("NDR") based devices, and more specifically, to on thinly capacitively coupled thyristor ("TCCT") memory technology. An example of a TCCT cell, alternatively referred to as a T-RAM cell (i.e., Thyristor-RAM), is disclosed in U.S. Pat. No. 6,229,161 issued to Nemati et al., which is incorporated herein by reference in its entirety.

FIG. 1 shows a pair of representative TCCT-based memory cells 10 as disclosed by Nemati et al., and FIG. 2 shows a cross-section through one TCCT-based memory cell 10 along the line 2—2. FIG. 3 shows a schematic circuit diagram corresponding to the example of an embodiment illustrated in FIGS. 1 and 2. The TCCT-based memory cell 10 includes an NDR device 12 and a pass transistor 14. A charge-plate or gate-like device 16 is disposed adjacent to, or as shown, surrounding NDR device 12. A P+ region 18 of the NDR device 12 is connected to a metallization layer 20 so that a first voltage $V_1$, such as an array supply voltage ("$V_{DDA}$") can be applied to the NDR device 12 through the P+ region 18. An N+ region of the NDR device 12 forms a storage node 22 that is connected to a source of the pass transistor 14. Where the pass transistor 14 is a MOSFET, it can be characterized by a channel length, L, and a width, W, where L is the spacing between the source and the drain, and W is the width of the pass transistor 14 in the direction perpendicular to the page of the drawing in FIG. 2. Assuming a constant applied voltage, a current passed by pass transistor 14 will scale proportionally to a ratio of W/L.

As shown in FIGS. 1 and 2, successive TCCT based memory cells 10 are joined by three lines, a bit line 26, a first word line (WL1) 28, and a second-word line (WL2) 30. The bit line 26 ("BL") connects a drain 32 of pass transistor 14 to other TCCT-based memory cells 10. In a similar fashion, pass transistor 14 includes a gate 34 coupled a portion of WL1 28. Likewise, gate-like device 16 is coupled to a portion of WL2 30.

In performing a read operation in connection with a TCCT-based memory cell 10, a logic "1" will be read out of the cell if the device is in an "on" state, such that it generates a current representing a logic 1. Similarly, a logic "0" will read out of the cell if the device is an "off" state, such that it produces essentially no current, and hence no voltage. In performing a write operation, a voltage having a relatively high potential, such as $V_{DD}$, is applied to the bit line 26 to write a logical "0" into a targeted TCCT-based memory cell 10. Conversely, a voltage having a relatively low potential, such as 0 V or ground, is applied to the bit 26 line to write a logical "1" into the TCCT-based memory cell. In both cases, WL2 is activated to accomplish writing either a logical "0" or "1" into the targeted TCCT-based memory cell 10.

FIG. 4 is a block diagram of circuit 401 depicting arrays of TCCT-based memory cells and reference memory cells arranged in an open-bit architecture. FIG. 4 includes a memory array 400, a reference memory array 414, a WL1/WL2 decoder 402, a RWL decoder 412 and a sense amplification circuit 410. Memory array 400 includes TCCT-based memory cells 404, 406, and reference memory array 414 includes TCCT-based reference memory cells 416, 418.

As shown, memory array 400 is coupled by bit lines BL1, BL2, BL3, etc., to sense amplification circuit 410. Also, reference memory array 414 is coupled by reference bit lines RBL1, RBL2, RBL3, etc., to sense amplification circuit 410. Sense amplification circuit 410 is also connected to complementary input/output lines IO and $IO_b$, which are designed to provide data access between an external source (not shown), such as a CPU, and the memory cells 404, 406.

In array 400, each of memory cells 404, 406 is coupled to a common word line pair (i.e., WL1 and WL2) to form a "row." For example, memory cells 1a, 2a, and 3a associated with word lines WL1a and WL2a form a first row, and memory cells 1b, 2b and 3b associated with word lines WL1b and WL2b form a second row. Similarly, each of reference memory cells 416, 418 in array 414 is coupled to a reference word line (i.e., RWL1) to form at least one row. Each of the rows in array 400, and the row in array 414, are connected to WL1/WL2 decoder 402 and reference RWL decoder 412, respectively.

WL1/WL2 decoder 402 and reference RWL decoder 412 provide for selection of a row during a memory operation. In particular, WL1/WL2 decoder 402 is connected to word lines WL1 and WL2 and decodes at least a portion of a memory address for selecting the appropriate memory cell (or cells, depending on the type of operation, such as block write to a block of memory cells). Similarly, RWL1 decoder 412 is connected to word line RWL1 for selecting the appropriate reference memory cell or cells during, for example, a read operation. Given circuit 401 depicted in FIG. 4, any specific TCCT-based memory cell 404, 406, can be accessed in read, write or other memory operation by applying a specific signal to the appropriate word line or lines.

Although circuit 401 of FIG. 4 can provide for read operations, it is not well-suited to reliably support either write operations or optimized memory access operations, such as read-over-write. Generally, writing to a targeted (i.e., selected for programming) memory cell residing in array 400 has a destructive affect on the nontargeted memory cells (i.e., cells not selected for programming) associated with the same row. The destructive nature of a write operation, unlike the read operation, is due to the activation of word line WL2a that is coupled to an entire row of memory cells, as shown in FIG. 4. In short, given the nature of TCCT-based memory cells, when an activating signal applied to a gate-like device of the thyristor, a unit of data stored previously therein can no longer be considered reliable.

For example, suppose targeted memory cell 406 is associated with a memory address for which data is to be written. During a write operation for circuit 401 of FIG. 4, WL1/WL2 decoder 402 activates targeted memory cell 406 (i.e., cell 1a). Targeted memory cell 406 is activated by applying a relatively high potential (e.g., approximately $V_{DD}$, or 1.2 V) to word line pair WL1a and WL2a, which is associated with target memory cell 406. Once targeted cell 406 is accessed, write data is driven via input/output lines IO and $IO_b$ onto the selected bit line BL2, and correspondingly, into target memory cell 406. When, however, a relatively high potential is applied to gate-like devices 16 of FIG. 2 of each associated memory cell 404, 406 of FIG. 4 (i.e., cells 1a, 2a and 3a), these memory cells are then configured to accept write driven from BL1, BL2 and BL3, respectively. That is, nontargeted memory cells 404 (i.e., cells 1a and 3a) are activated for programming without being written. Hence, the latching state of the TCCT devices in the non-targeted memory cells 1a and 3a most is likely affected, thus making the previously stored data bits from these cells no longer reliable. Consequently, simple open-bit line architectures that have been used with conventional memory technologies are not well-suited to reliably support write operations and read-over-write operations for arrays including TCCT-based memory cells.

Therefore, what is desired is a circuit and a method for providing reliable and non-destructive write operations as well as other optimized memory access operations in connection with TCCT-based memory cells, and arrays thereof, to preserve the integrity of data stored in memory cells not selected for programming. Also, it is desired to provide a circuit and a method that also preserves the relatively low power consumptive nature of TCCT-based arrays during memory access-related operations, such as during write operations.

SUMMARY

The present invention provides a circuit and a method for providing non-destructive write operations as well as other optimized memory access operations, such as a read-over write operation, in connection with TCCT-based memory cells. Moreover, the present invention also provides a circuit and a method that preserves the relatively low power consumptive nature of TCCT-based arrays, such as during write operations and other memory access-related operations.

In one embodiment, a memory device for storing one or more data bits is disclosed, where one or more of the data bits is associated with either a first logic state magnitude (to represent a first logic state) or and a second logic state magnitude (to represent a second logic state). The memory device comprises a memory cell configured to store a first data bit, and a write access circuit coupled to the memory cell for providing a write data bit having a write data bit magnitude. The write access circuit is configured to adjust the write data bit magnitude to an intermediate logic state magnitude in a memory operation.

In another embodiment, the memory cell is a thinly capacitively-coupled thyristor (TCCT) device. In other embodiments, the write access circuit adjusts the write data bit magnitude for only one of either the first logic state or the second logic state associated with the write data bit. For example, the internal logical state magnitude can represent either the first logic state or the second logic state. The intermediate logic state magnitude is between that of the first logic state magnitude and the second logic state magnitude such that there is a reduction in power consumed by the memory device during a memory operation.

In yet another embodiment, a write access circuit is disclosed for programming a memory cell during a write operation. The write access circuit comprises a transfer circuit configured to transfer a data bit during a first portion of the write operation and a driver register circuit configured to store the data bit and to drive a write data bit. The driver-register circuit has an output and an input, with the input coupled to the transfer circuit to receive the data bit. The write access circuit also comprises an adjuster circuit coupled to the output of the driver register circuit. The adjuster circuit, for example, is designed to adjust a characteristic of the write data bit during a second portion of the write operation. In one embodiment the characteristic is the magnitude of the write data bit. In another embodiment, the characteristic is a period of time.

BRIEF DESCRIPTION OF DRAWINGS

The present invention is illustrated by way of example, and not by way of limitation, in the figures of the accompanying drawings where like reference numerals frequently refer to similar elements and in which.

DETAILED DESCRIPTION OF SPECIFIC EMBODIMENTS

Detailed descriptions of exemplary embodiments are provided herein. It is to be understood, however, that the present invention may be embodied in various forms. Therefore, specific details disclosed herein are not to be interpreted as limiting, but rather as a basis for the claims and as a representative basis for teaching one skilled in the art to employ the present invention in virtually any appropriately detailed system, structure, method, process or manner.

The term "device" is used herein to describe both a discrete semiconductor circuit element, such as a MOS transistor or a TCCT device, as well as a semiconductor product. A memory semiconductor product can be referred also as a memory "chip" or "integrated circuit" and is a circuit element operating cooperatively with other semiconductor products, such as a microprocessor. An "operation" described herein can refer to a process, from a request to initiate. the process to the completion of the process, such as reading data from or writing data to memory. A "transfer cycle," however, can refer to a discrete sub-process of an operation, such as a read or a write transfer cycle. For example, a write operation can include a read-like operation (i.e., "a read transfer cycle") to facilitate data preservation in non-targeted memory cells. The term "data" can refer herein to one or more units of data, such as one or more "bits" or "data bits." Although "connected to" generally describes a direct link or an attachment that does not include an intervening element, and "coupled to" generally describes a link or attachment that can include either a direct linkage (i.e., with an intervening element and typically requires a direct physical and/or mechanical attachment) or an indirect linkage (i.e., without an intervening element and/or does not require a direct physical or mechanical attachment), these terms can be interchanged without departing from the scope and spirit of the present invention.

Although the following exemplary circuits and methods are described generally in conjunction with a write operation and a specific optimized memory access operation (i.e., a read-over-write operation) the disclosed circuits and methods are designed to accommodate read operations as well as any other memory access-related operation, such as block write operation, for enhancing data processing rates.

Figure 5:
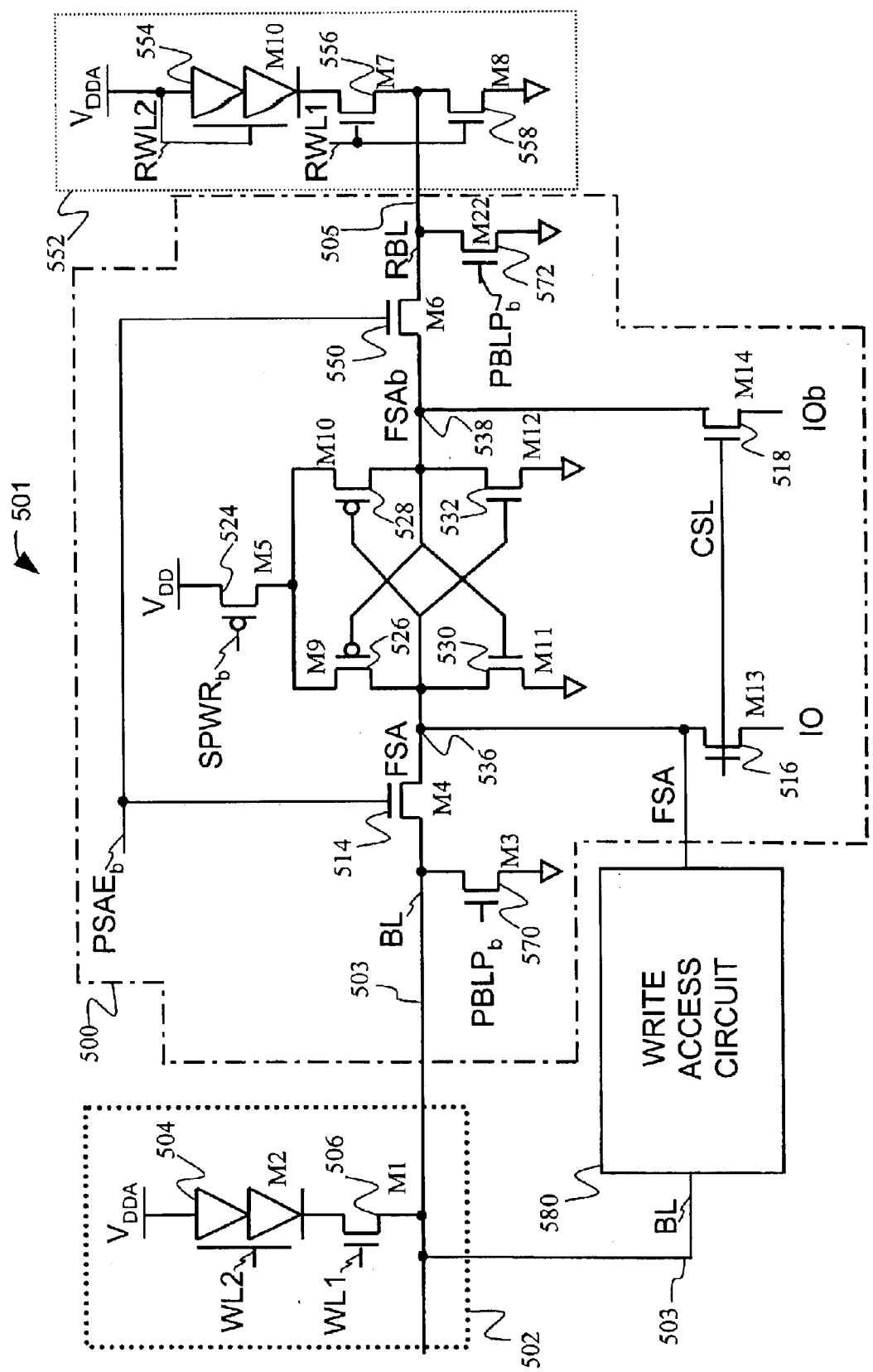
FIG. 5 is a schematic diagram of an exemplary circuit for supporting write operations and optimized memory access operations in accordance with a specific embodiment of the present invention.

FIG. 5 illustrates an exemplary circuit for performing a write operation in accordance with one embodiment of the present invention. Exemplary circuit 501 of FIG. 5 includes a sensing circuit 500, an NDR-based memory cell 502, an NDR-based reference cell 552 and an access-dependent data retention and driver circuit 580 ("write access circuit"). NDR-based memory cell 502 is connected by a bit line ("BL") 503 to sensing circuit 500. Similarly, NDR-based reference cell 552 is connected by a reference bit line ("RBL") 505 to sensing circuit 500. In a specific embodiment, the NDR-based memory cell 502 and the NDR-based reference cell 552 are TCCT-based memory cells. Write access circuit 580 is connected to bit line 503 and to a sense amplifier input 536 ("node FSA") of sensing circuit 500.

Generally, TCCT-based memory cell 502 operates to provide a stored data signal representing a unit of data (i.e., a data bit) to node 536. Such data signals, for example, can have a magnitude of about 200 to 250 mV to represent a logical one, and a magnitude of about 0 mV to represent a logical zero. TCCT-based reference cell 552 operates to provide to node 538 a reference signal, which operates as a reliable baseline against which to compare the data signal. The reference signal can be designed to have a magnitude of approximately one-half of the magnitude of the data signal that represents logical one, or alternatively, an average of the magnitudes respectively associated with logical one and zero.

Sensing circuit 500 operates to determine a logical state associated with a unit of data stored in TCCT-based-memory cell 502 based on the data and reference signals. In a read operation, sensing circuit 500 resolves the data signal into a logic signal (such as into a logical one or zero) depending on the magnitude of the data signal (such as 1.2 V or 0 mV). In a write operation, sensing circuit 500 functions to deliver write data to a selected bit line for programming a unit of data into a targeted memory cell 502. Sensing circuit 500 together with write access circuit 580 also functions to facilitate the preservation of previously stored data from nontargeted memory cell having a common word line WL2 with the targeted memory cell. Sensing circuit 500 also operates in preservation of a data bit of a nontargeted memory cell that shares a common WL2 with a targeted memory cell, as will be discussed below.

Write access circuit 580 functions to preserve the data of nontargeted memory cells when associated word lines WL2 are in states of activation. Additionally, write access circuit 580 can be configured to minimize the overall power consumed by a collection of TCCT-based memory cells, especially during a write operation. Lastly, write access circuit 580 can be operable to facilitate optimized memory access operations, such as read-over-write.

Elements of circuit 501 of FIG. 5 are described more specifically as follows. TCCT-based memory cell 502 includes an NDR device M2 504 having an anode coupled to a relatively high potential, such as $V_{DDA}$, and a cathode connected to a drain terminal of a pass transistor M1 506. A source terminal of pass transistor 506 is connected to the bit line 503. A gate-like device of NDR device M2 504 and a gate of pass transistor 506 are designed to receive control signals, such as word lines two ("WL2") and one ("WL1"), respectively. In this example, NDR device M2 504 is a thyristor-based device. Additionally, pass transistor 506 is an n-channel metal oxide silicon ("NMOS") device, of which the operation, structure and manufacture thereof is well known in the art.

Reference memory cell 552 is configured to operate as a dedicated reference source to provide a reliably stable and accurate reference signal (e.g., reference voltages or currents) against which to compare a data signal (e.g., a voltage or current) representing a unit of data stored in a memory cell 502 during sense amplification. Reference memory cell 552 includes device M10 554 having an anode coupled to its gate-like device (i.e. reference word line two "RWL2" can be fixed to its activated state) so that both receive a relatively high voltage, such as $V_{DDA}$ or other like voltages. When $V_{DDA}$ is applied to both the anode and the gate-like device of M10 554, device M10 554 is in an "on" state to provide a dedicated data signal as a pre-reference voltage. The pre-reference voltage signal has a magnitude substantially equivalent to the data signal representing a logical one, as provided by TCCT device 504 of memory cell 502. Although reference memory cell 552 generally does not function to store units of data and thus does not operate as a standard memory cell, an artisan of ordinary skill should appreciate that reference memory cell 552 can be adapted to accept written data for storage.

Reference memory cell 552 also includes a pass transistor M7 556 for providing the pre-reference signal to reference bit line 505. Pass transistor M7 556 has a drain terminal coupled to the cathode of M10 554, a source terminal coupled to reference bit line 505, and a gate terminal designed to receive a control signal on reference word line one ("RWL1"). Typically, the control signal on RWL1 is generated by a RWL1 decoder circuit (not shown).

Reference cell 552 further includes a resistive element, such as a pull-down transistor M8 558 to provide for the generation of a reference signal from the pre-reference signal. Pull-down transistor M8 558 is coupled between reference bit line 505 and a relatively low potential (e.g., ground) for clamping, or limiting, reference bit line 505 to a specific voltage level. A gate of pull-down transistor M8 558 is coupled to receive an activation signal for initiating operation of pull-down transistor M8 558. In some embodiments the activation signal is also received from RWL1 so that the operations of M8 558 and M7 556 are performed near or at the same time.

In operation, reference cell 552 is used to produce a reference signal having a margin substantially proportional (e.g., approximately ½) to the maximum data signal voltage reached on bit line 503. In some embodiments, the magnitudes of the data signal representing a logical one (i.e., D '1') and logical zero (i.e., D '0') are respectively configured to be approximately 200 millivolts ("mV") and 0 mV. In these embodiments, the reference signal voltage on reference bit line 505 ideally rises to about 100 mV, thus providing a margin of ±100 mV between the reference voltages and the data signals associated with either D '0' and D '1.'

Together, pass transistor M7 556 and pull-down transistor M8 558 are configured to operate as a voltage divider using a pre-reference voltage (or current) from M10 554. In particular, M7 556 and M8 558 are designed such that the pre-reference voltage is divided across individual devices M7 556 and M8 558, either equally or differently, to provide a reference signal voltage at reference bit line 505. For example, if M7 556 and M8 558 have approximately the same resistance, then the voltage drop across each M7 556 and M8 558 is equivalent. Thus, if TCCT devices M2 504 and M10 554 respectively produce a data signal and a pre-reference signal having substantially the same magnitude, then the magnitude of the reference signal (i.e., voltage on the reference bit line) is about one-half that of the data signal.

A suitable reference cell for practicing a specific embodiment of the present invention is disclosed in an patent application owned by common assignee, T-RAM, Inc., which is entitled "Reference Cells for TCCT-Based Memory Cells," U.S. patent application Ser. No. 10/117,930, filed on Apr. 5, 2002, and is incorporated herein by reference for all purposes.

An exemplary signal sensing circuit suitable to practice a specific embodiment of the present invention is shown in FIG. 5 as sensing circuit 500. As shown, sensing circuit 500 includes a differential amplifier for performing the sensing function. In the example shown in FIG. 5, sensing circuit 500 includes an NMOS transistor device M3 570 for equalizing the amount of charge on bit line 503 to ground or any other potential level by, for example, discharging excess charge (i.e., pre-charging the bit line 503 to ground). With excess charge discharged, signal propagation is faster and more reliable than if excess charge is left on signal lines in which data and reference signals are applied. The device 570 has a drain terminal coupled to the bit line 503, a gate terminal configured to receive pre-charge bit line control signal ("PBLP$_b$") and a source terminal coupled to a relatively low potential, such as ground. Upon receiving an activating control signal, PBLP$_b$, device 570 operates to provide a path to the low potential (i.e., ground) so as to pre-charge the bit line 503 to the low potential. Similarly, device 572 includes a structure that functions equivalently to device 570 but with respect to reference bit line 505.

Sensing circuit 500 also includes sense amplifier-enable devices M4 514 and M6 550. Devices 514 and 550 function to enable signals on bit line 503 and reference bit line 505 to be applied to nodes FSA 536 and FSA$_b$ 538, respectively, which are input terminals of the exemplary sense amplifier of sensing circuit 500. Each sense amplifier enable device 514 and 550 has a first terminal (e.g., drain) coupled to respective nodes FSA 536 and FSA$_b$ 538, a second terminal (e.g., source) coupled respectively to bit line 503 and reference bit line 505, and a gate terminal configured to receive sense amplifier enable control signal ("PSAE$_b$"). When devices 514 and 550 receive control signal PSAE$_b$, they activate to provide paths from memory cell 502 to node FSA 536 and from reference cell 552 to node FSA$_b$ 538.

The exemplary sense amplifier shown in FIG. 5 is a cross-coupled inverter pair, each inverter composed of complementary metal oxide semiconductor ("CMOS") transistor devices. More specifically, the sense amplifier includes a first inverter having an output terminal connected to an input terminal of a second inverter, and the second inverter's output terminal is connected to an input terminal of the first inverter.

The first CMOS inverter includes p-channel MOSFET ("PMOS") device 526 and NMOS device 530 in a cross-coupled configuration with the second CMOS inverter. The second inverter includes PMOS device 528 and NMOS device 532. NMOS devices 530 and 532 each have a source terminal coupled to a low potential such as ground. A drain terminal of device 526 is coupled to a drain terminal of device 530 at node FSA 536, and similarly, a drain terminal of device 528 is coupled to a drain terminal of device 532 at node FSA$_b$ 538. Device 526 has a source terminal coupled to a common node (i.e., "PMOS source node") to which a source terminal of device 528 is also coupled.

Device 524, in this example, is a PMOS transistor device coupled between the PMOS source node and a relatively high potential, such as $V_{DD}$. In particular, device 524 has a source terminal coupled to $V_{DD}$, a drain terminal coupled to the PMOS source node (and thus to the source terminals of devices 526 and 528), and a gate terminal configured to receive a sensing power control signal ("SPWR$_b$"). Device 524 operates to provide power to the sense amplifier during the sensing stage of a memory read cycle for enabling the functionality of the sense amplifier. One having ordinary skill in the art will appreciate that in certain applications device 524 is optional and that the PMOS source node can be connected directly to $V_{DD}$. In other embodiments, a device similar in functionality to device 524, but suited for operation with devices 530 and 532, can be coupled between the sources of devices 530 and 532 and a low potential, such as ground.

Sensing circuit 500 further includes input/output transistor devices 516 and 518 associated respectively with an input/output line ("IO") and its complement ("IO$_b$"). Each input/output device 516 and 518 has a first terminal (e.g., drain) coupled to respective nodes FSA 536 and FSA$_b$ 538, a second terminal (e.g., source) coupled to a relatively low potential, such as ground, and a common gate terminal configured to receive a column select control signal ("CSL"). In a read operation, control signal CSL can be applied to activate 516 and 518 for transmitting complementary sense amplifier output signals. The IO and IO$_b$ signals represent a resolved data signal for use outside a memory array in which the memory cell resides. Such outputs can be sent to either a global sense amplifier, global complementary input/output lines, and/or to other circuitry in which the processing of the data signal is desired.

55J In a write operation, a control signal CSL can be applied to activate devices 516 and 518 for transferring a unit of write data onto bit line 503 for subsequent storage in targeted memory cell 502. When a targeted memory cell is selected to be programmed, an associated input/output transistor device pair 516 and 518 is activated by control signal CSL. In contrast, nontargeted memory cells that are not selected to be programmed will have their associated input/output transistor device pairs 516 and 518 remain inactive (i.e., CSL is in a nonactivating state) to prevent nontargeted memory cells from being erroneously programmed.

A suitable sensing circuit for practicing a specific embodiment of the present invention is disclosed in a patent application owned by common assignee, T-RAM, Inc., entitled "Bit Line Control and Sense Amplification for TCCT-based memory cells," U.S. patent application Ser. No. 10/191,686, filed on Jul. 5, 2002, and are incorporated herein by reference for all purposes.

Write access circuit 580 is connected to bit line 503 and node FSA 536 and is configured to do at least one of the following: preserve data stored in a nontargeted memory cell after a write operation has been invoked, minimize power consumption during a write operation, and/or facilitate optimized memory access operations. In particular, write access circuit 580 is configured to temporarily preserve previously stored data of a nontargeted memory cell intermediately until the data can restored. Additionally, write access circuit 580 is designed to adjust the magnitude of a write data signal during at least one write transfer cycle for minimizing power consumption, for example. Furthermore, write access circuit 580 is designed to operate to provide for read-over-write operations.

The following discussion describes generally the behavior of write access circuit 580 during a write operation and an optimized memory access, such as a read-over-write operation. A more detailed discussion of exemplary write access circuit 580 according to alternate embodiments is presented in connection with FIGS. 6 to 11.

In a specific embodiment, a write operation includes at least one read transfer cycle and one or more write transfer cycles. A read transfer cycle is a portion of the write operation (typically before a write transfer) where stored data from nontargeted memory cells, as well as write data from input/output lines IO and IO$_b$, are transferred into associated write access circuit 580. A write transfer is a portion of the write operation where a unit of write data stored in write access circuit 580 is driven onto bit line 503 for programming the targeted and nontargeted cells. With respect to FIG. 5, during a read transfer cycle, data is read into write access circuit 580. For a targeted memory cell, data to be written to that cell is read from input/output lines IO and IO$_b$, and eventually, into write access circuit 580. For a nontargeted memory cell associated with the same WL2 line as the targeted cell, data to be temporarily preserved is read (i.e., transferred) into write access circuit 580 from nontargeted cell 502. During a write transfer cycle, data in write access circuit 580 is driven onto bit line 503 to program memory cell 502.

First, programming a targeted TCCT-based memory cell 502 to store a write data bit is described. In an exemplary write operation, the first transfer cycle is a read transfer cycle. In the read transfer cycle, a pre-existing data bit stored in the targeted TCCT-based memory cell 502, prior to the start of the write operation, is transmitted onto bit line 503, and ultimately to node FSA 536. Hence, node FSA 536, for example, either has a voltage of about 200 mV if the stored data is represented by a logical one, or a voltage of 0 mV if the stored data is represented by a logical zero.

During the same read transfer cycle, an external write data signal is driven onto complementary input/output lines IO and IO$_b$ via devices 516 and 518, and then ultimately to nodes FSA 536 and FSA$_b$ 538, respectively. The external write data signal, however, drives node FSA 536 more strongly than memory cell 502. Consequently, the original stored data (e.g., stored data bit) is replaced with the new write data (e.g., write data bit) to be programmed into the targeted memory cell. Thereafter, the external write data signal is transferred into driver-register 580 for subsequent writing to the targeted memory cell 502.

Next, a write operation for a nontargeted TCCT-based memory cell that needs to retain stored data is described. During a read transfer cycle of the write operation, a data signal representing the data stored in nontargeted TCCT-based memory cell 502 is transmitted onto bit line 503, and then ultimately to node FSA 536. With signal CSL inactive, and input/output devices 516 and 518 disabled, the data signal at node FSA 536 is resolved by the sense amplifier into a write data signal equivalent to either a logical zero (i.e., ground, or 0 mV) or one (i.e., $V_{DD}$, or 1.2 V). Thereafter, the resolved data signal is transferred into write access circuit 580 to be subsequently written back to the nontargeted memory cell 502.

In a write transfer cycle, regardless of whether a cell is targeted or nontargeted, an associated write access circuit 580 can operate to adjustably drive the write data stored therein onto bit line 503 for programming or reprogramming a unit of data into TCCT-based memory cell 502. If the data or data bit is a logical zero, the associated write data signal that is driven onto bit line 503 will have a magnitude of approximately $V_{DD}$ to represent a logical one. In one embodiment, if $V_{DDA}$ is about 1.3 V and $V_{DD}$ is about 1.2 V, then the voltage drop across TCCT-based memory cell 502 is approximately 0.1 V. In this case, when the write data signal of 1.2 V (i.e., $V_{DD}$) is applied to bit line 503 for programming memory cell 502, a voltage of 0.1 V develops across memory cell 502 from $V_{DDA}$ to $V_{DD}$ on bit line 503.

If, however, the data to be programmed is a logical one, the associated write data signal driven onto bit line 503 will have a magnitude of approximate to ground, or 0 mV, when the write data signal is not adjusted. Without adjustment, a current develops through both TCCT-based memory cell 502 and driver-receiver 580 that is proportionate to the voltage drop. In particular, the current is equivalent to the voltage drop between $V_{DDA}$ (i.e., 1.3 V) and ground (i.e., 0 V), when bit line 503 is driven to ground. Since power is related to voltage and current, the power consumed by the specific memory cell 502 in this case is greater than when bit line 503 is driven to $V_{DD}$ as discussed previously. Given that there could be numerous other memory cells associated with the same selected word line pair WL1 and WL2 having the same data stored therein, there exists an overall amount of power consumed due to the collective associated current paths where the power consumed directly relates to the magnitude of each voltage drop.

To minimize the amount of power consumed during write operations, write access circuit 580 can be configured to provide a write data signal having a magnitude greater than ground (i.e., >0 mV) so as to decrease the associated voltage drop, and consequently, the power consumed. In one embodiment, write access circuit 580 adjusts the write data signal magnitude to an intermediate magnitude of 0.3 V to reduce the voltage drop across each memory cell to about 1.0 V, when a logical one is to be written. Accordingly, write access circuit 580 is designed to minimize power consumption during write operations, and more specifically, during write transfer cycles. In some embodiments, the intermediate magnitude of the write data signal is in the exemplary range of 0.2 V to 0.6 V.

Next, an optimized memory access operation, such as read-over-write, that affects a TCCT-based memory cell targeted for storing write data during an interrupted write operation will be described. As described earlier, a read-over-write operation can be understood to be a read operation that accesses a memory cell while a pending write operation is suspended. After the read transfer cycle of a write operation has been initiated and an associated word line WL2 signal has been activated, the data stored within targeted TCCT-based memory cell 502 is no longer reliable.

Although the data originally stored within targeted TCCT-based memory cell 502 is no longer available after a read transfer cycle, the requested data can still be accessed from write access circuit 580. To read the data out of the memory array, a write transfer cycle is initiated so that data write access circuit 580 can drive the data via bit line 503 out to at least one of the input/output lines IO and $IO_b$. Thereafter, the data can be accessed by an external source requesting the data. To expeditiously and reliably provide data in a read-over-write operation, write access circuit 580 operates in a manner to minimize residual charge on bit line 503, as described next.

A suspended write operation, in response to a read-over-write operation request, can result in an indeterminate amount of residual charge on bit line 503 and at node FSA 536. The residual charge generally represents a previous logical value of the previously stored data from targeted TCCT-based memory cell 502. Write access circuit 580, however, is configured to adjust its output drive level (i.e., magnitude of the write data signal) so as to quickly discharge bit line 503 by adjusting its write data signal magnitude from 0.3 V to 0 V. Alternatively, write access circuit 580 can drive bit line 503 to $V_{DD}$. Regardless of the logic value, the output of write access circuit 580 therefore ensures that node FSA 536 is quickly driven to a reliable state, which results in speedy and accurate reading of data in response to an invoked read-over-write operation.

In one embodiment, an inverter circuit (not shown) can be used when an optimized memory access operation is initiated. The inverter circuit translates the logic level associated with the write data signal from the write access circuit 580 to an equivalent logical state that was stored in the memory cell 502. For example, if a logical one is to be written into memory cell 502, then the magnitude of the write data signal should be equivalent to the write data's complement, such as 0 mV. When read from memory cell 502, the data is associated with a data signal representing a logical one. When read from write access circuit 580, the data is associated with a write data signal equivalent to a logical zero (i.e., complement of data stored). Thus, an inverter circuit can prove useful in determining the logical values of data during a read-over-write operation.

Figure 6:
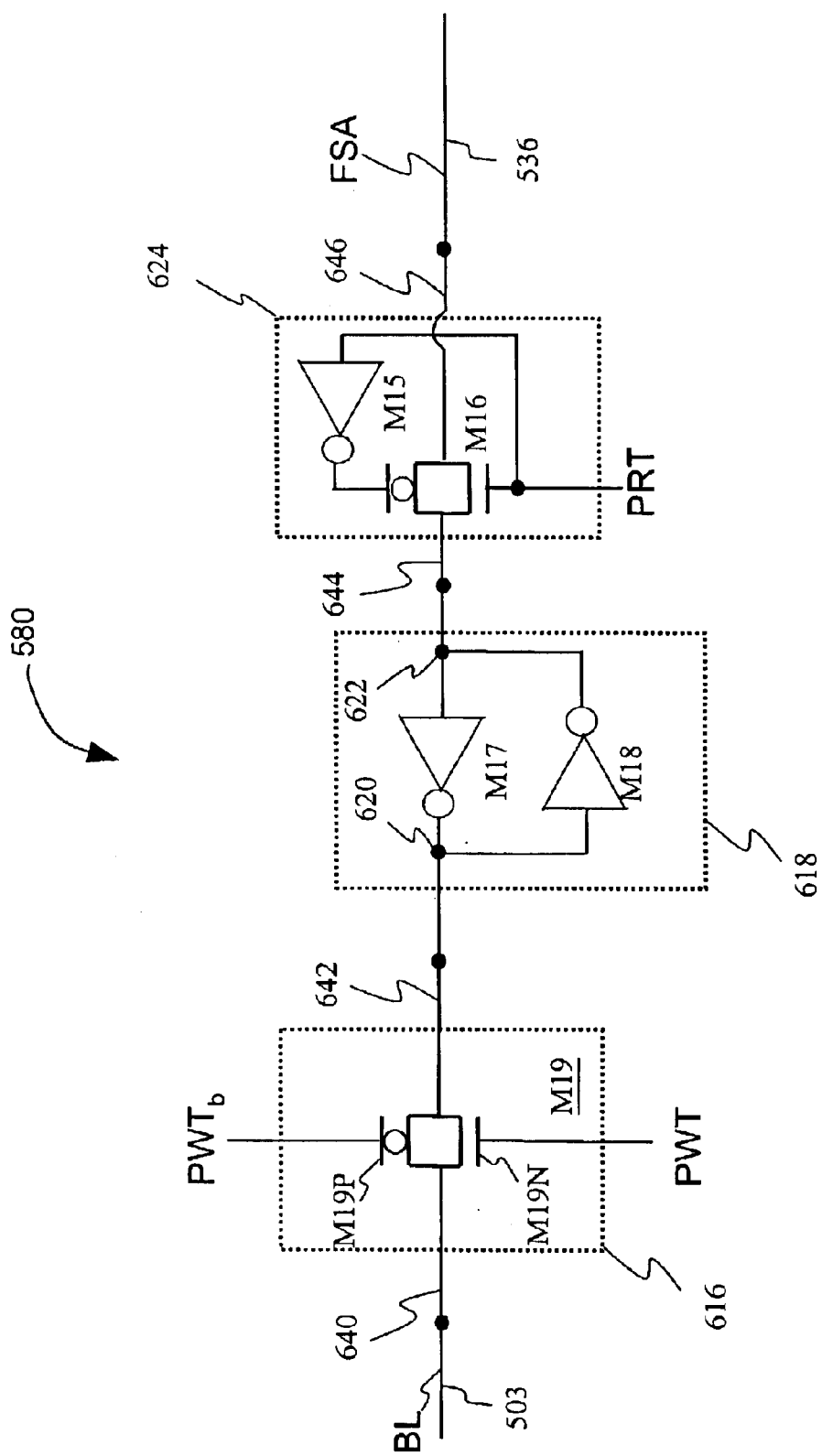
FIG. 6 is a schematic circuit diagram of an exemplary write access circuit in accordance with one embodiment of the present invention.

FIG. 6 is a schematic diagram of one example of write data circuit 580, according to a specific embodiment of the present invention. In this instance, write data circuit 580 includes a write data transfer circuit ("transfer circuit") 624, a driver-register circuit 618, and a driver adjuster circuit ("adjuster") 616. Transfer circuit 624 is configured to transfer signals from node FSA 536 to driver-register circuit 618 at an appropriate time. Exemplary transfer circuit 624 has an input 646 connected to node FSA 536 and has an output 644 configured to provide, for example, a signal from node FSA 536.

Exemplary transfer circuit 624 includes at least a transmission gate M16 designed to receive a write-related control signal, such as read transfer signal "PRT." In this instance, transmission gate M16 includes an NMOS component, a PMOS component and two control input terminals for controlling data transfer. The first control input terminal is a gate of the NMOS component and is adapted to receive signal PRT for controlling data transfers. The second control input terminal is a gate of the PMOS component, which optionally can be controlled by an inverter device M15.

In the example of an embodiment shown in FIG. 6, an input of inverter device M15 is configured to receive signal PRT and an output of inverter device M15 is connected to the gate of the PMOS component of M16. Upon receiving an activation state of signal PRT, transfer circuit 624 operates to transfer write data from input 646 of transmission gate M16 (i.e., node FSA) to output 644 of transmission gate M16, which is connected to an input of driver-register circuit 618. It should be noted that when the data read from memory cell 502 during the read transfer cycle is a logical one, a voltage of $V_{DD}$ is transferred through transfer circuit 624 to output 644. Likewise, a voltage of about ground is transferred when the data is a logical zero.

Figure 1:
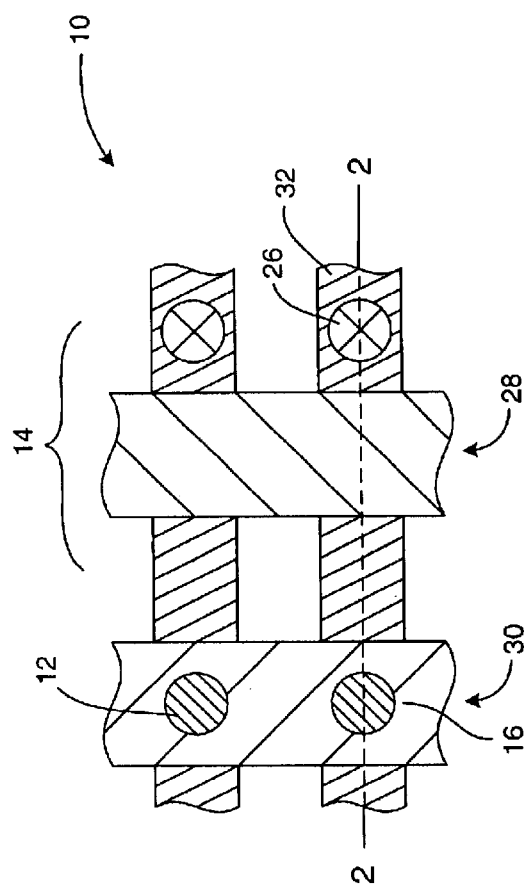
FIG. 1 shows a TCCT-based memory cell of the prior art.
Figure 2:
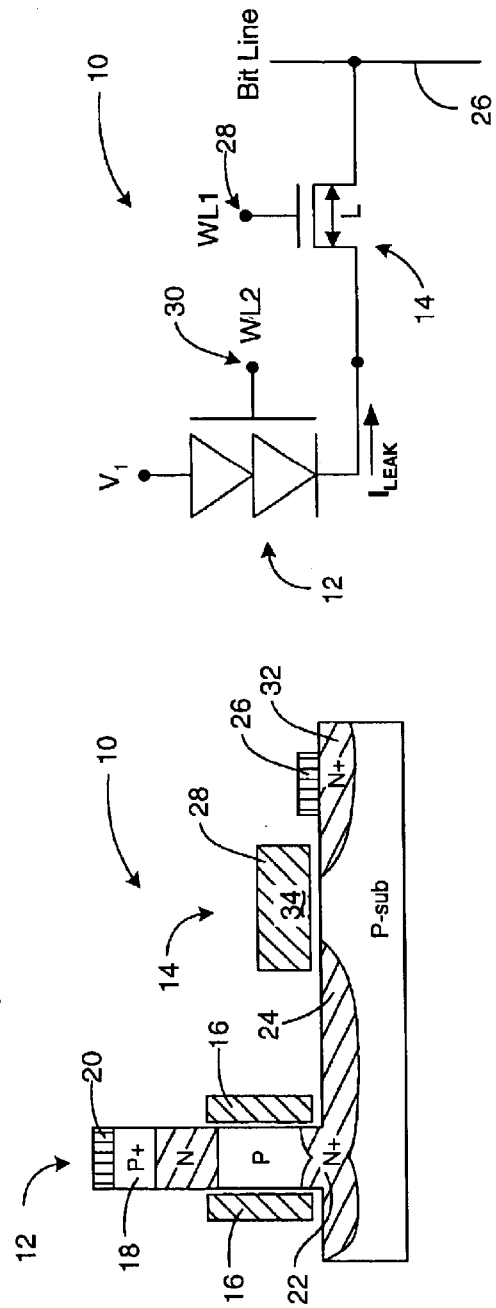
FIG. 2 shows a cross-section of the TCCT-based memory cell of FIG. 1.
Figure 3:
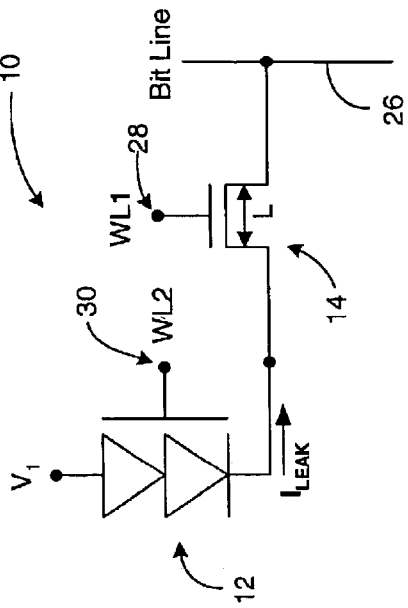
FIG. 3 shows a schematic circuit diagram of the TCCT-based memory cell of FIG. 1.
Figure 4:
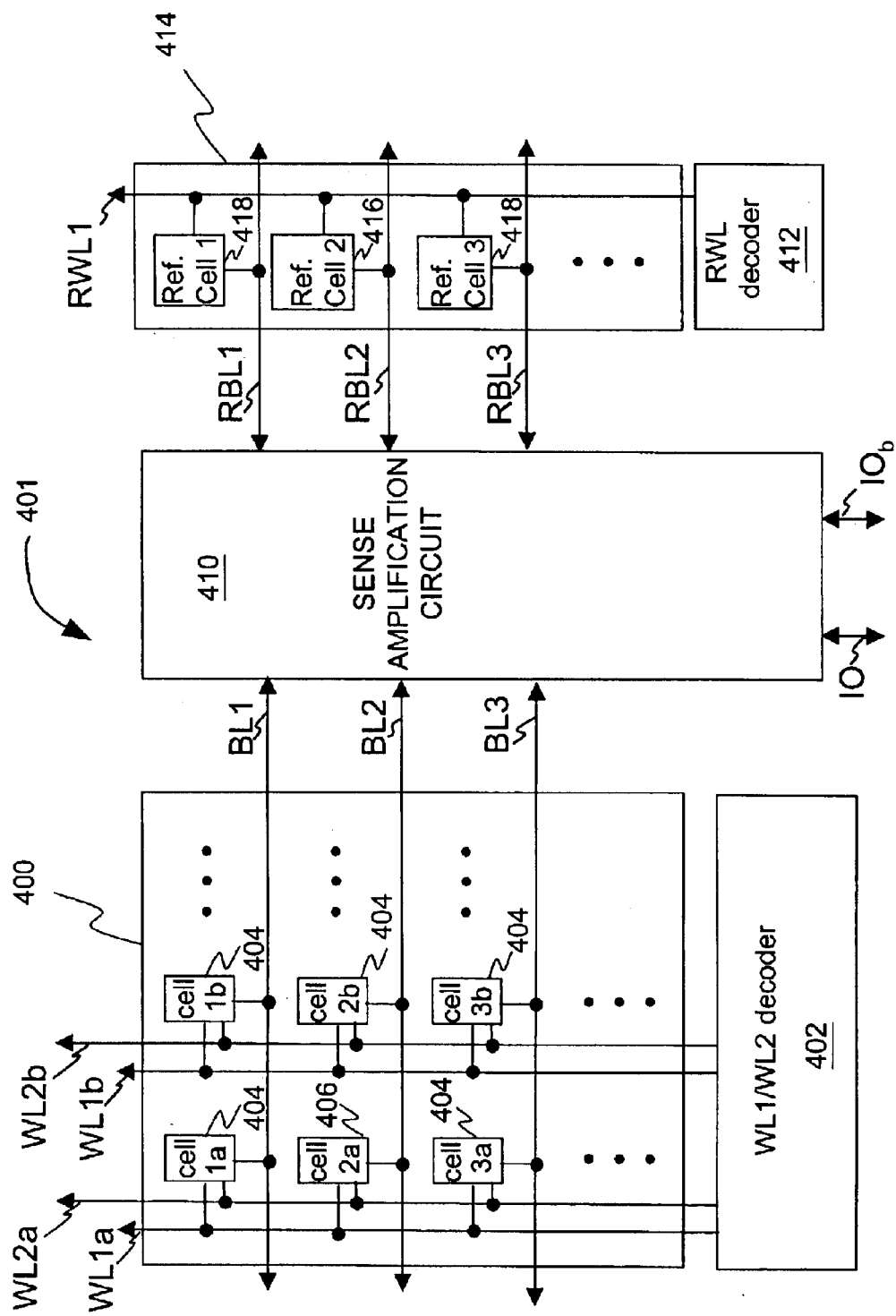
FIG. 4 is a representation of a simple open-bit architecture implementing both TCCT-based memory and reference cells.

Driver-register circuit 618 is designed to provide a capability of effectively driving write data onto bit line 503 for writing to a TCCT-based memory cell 502 as well as for performing other operations, such as read-over-write. Driver-register circuit 618 is also designed to provide a data register-like function by storing, or latching, write data during some memory access operations, such as in a read transfer cycle of a write operation. As described previously with reference to FIG. 3, writing a logical one to a TCCT-based memory cell 502 requires that a relatively low voltage be applied to the bit cell 503 when WL2 is activated. And similarly, a relatively high voltage is applied to the bit cell 503 to write a logical zero. In one embodiment, driver-register circuit 618 can operate to provide write data signal magnitudes of 0 V and 1.2 V for writing a logical 1 and a logical 0, respectively.

An exemplary driver-register circuit 618 suitable for realizing write access circuit 580 of FIG. 5 includes a first inverter device M17 and a second inverter device M18, as shown in FIG. 6. Inverter device M17 has an input connected to an output of M18 and to the output of transfer circuit 624 at node 622. The output of inverter device M17 is connected at node 620 to an input of inverter device M18 and is configured to provide the output of driver-register 618 to adjuster 616. One having ordinary skill in the art will appreciate that each inverter M17, M18 can be designed to include device sizes that are most suited to practice the present invention.

Adjuster 616 is configured to receive, to adjust and to provide write data to bit line 503. Adjustment of the write data, for example, can include modifying the magnitude of a write data signal representing the logical state of write data. For example, a write data signal having about 0 V can be adjusted to a higher magnitude, such as 0.3 volts. An exemplary adjuster 616 suitable for realizing write access circuit 580 of FIG. 5 can include a transmission gate M19 of FIG. 6.

Adjuster 616 can include, for example, transmission gate M19 having a write data signal input 642 and output 640. Write data input 642 is connected to node 620 to receive the output of driver-register 618, and write data output 640 is connected to bit line 503 to program a specific memory cell 502. In one embodiment, driver-register circuit 618 can operate to provide an adjusted write data signal magnitude of 0.3 V for representing a logical one to be programmed into the specific memory cell 502. Additionally, driver-register circuit 618 can operate to provide an unadjusted write data signal magnitude of 1.2 V for representing a logical zero.

In one embodiment, adjuster 616 can be configured to adjust a write data signal from driver-register 618 by an amount of voltage dependent on a device characteristic of one or more components constituting transmission gate M19. Transmission gate M19 can include a PMOS component M19P and an NMOS component M19N. In a specific embodiment, the device characteristics of PMOS component M19P are designed such that the threshold voltage ("$V_{Tp}$") of M19 is 0.3 V. A PMOS component designed with a $V_{Tp}$ of 0.3 V will therefore operate to clamp or limit the write data magnitude on bit line 503 to 0.3 V, thus minimizing a voltage drop across memory cell 502 to reduce power consumption. An artisan of ordinary skill should appreciate that the threshold voltage can be set at other voltages other than 0.3 V.

Transmission gate M19 also has two control input terminals for receiving separate write-related control signals, such as write transfer signal "PWT" and complementary write transfer signal "$PWT_b$." A first control input terminal can be a gate of PMOS component M19P adapted to receive signal $PWT_b$, and a second control input terminal can be a gate of NMOS component M19N adapted to receive signal PWT for controlling data transfers.

In operation of adjuster 616, write transfer signals PWT and $PWT_b$ can be independently applied to the input terminals of transmission gate M19 and need not be in activating states at the same time. For example, during a write transfer cycle of a write operation, write transfer signal $PWT_b$ might be the only write transfer control signal applied to transmission gate M19 for writing to a memory cell 502. More specifically, when writing a logical one to memory cell 502 of FIG. 5, write transfer signal $PWT_b$ is in an activating state (i.e., low) whereas write transfer signal PWT remains in an inactivating state (i.e., low).

In the context of a read-over-write operation, both write transfer signals PWT and $PWT_b$ can be applied to transmission gate M19 for providing read data during an interrupted write operation, as described above. More specifically, when driving bit line 503 with a logical one (e.g., having a write data magnitude of 0.3 V) for programming memory cell 502 of FIG. 5, write transfer signals PWT and $PWT_b$ are in respective low (e.g., 0 mV) and high (e.g., 1.2 V) activation states, for example. With both M19N and M19P in an "on" state, the driver-register 618 can operate to sufficiently drive bit line 503 to minimize any residual effects on bit line 503 from the formerly stored data of memory cell 502.

Figure 7:
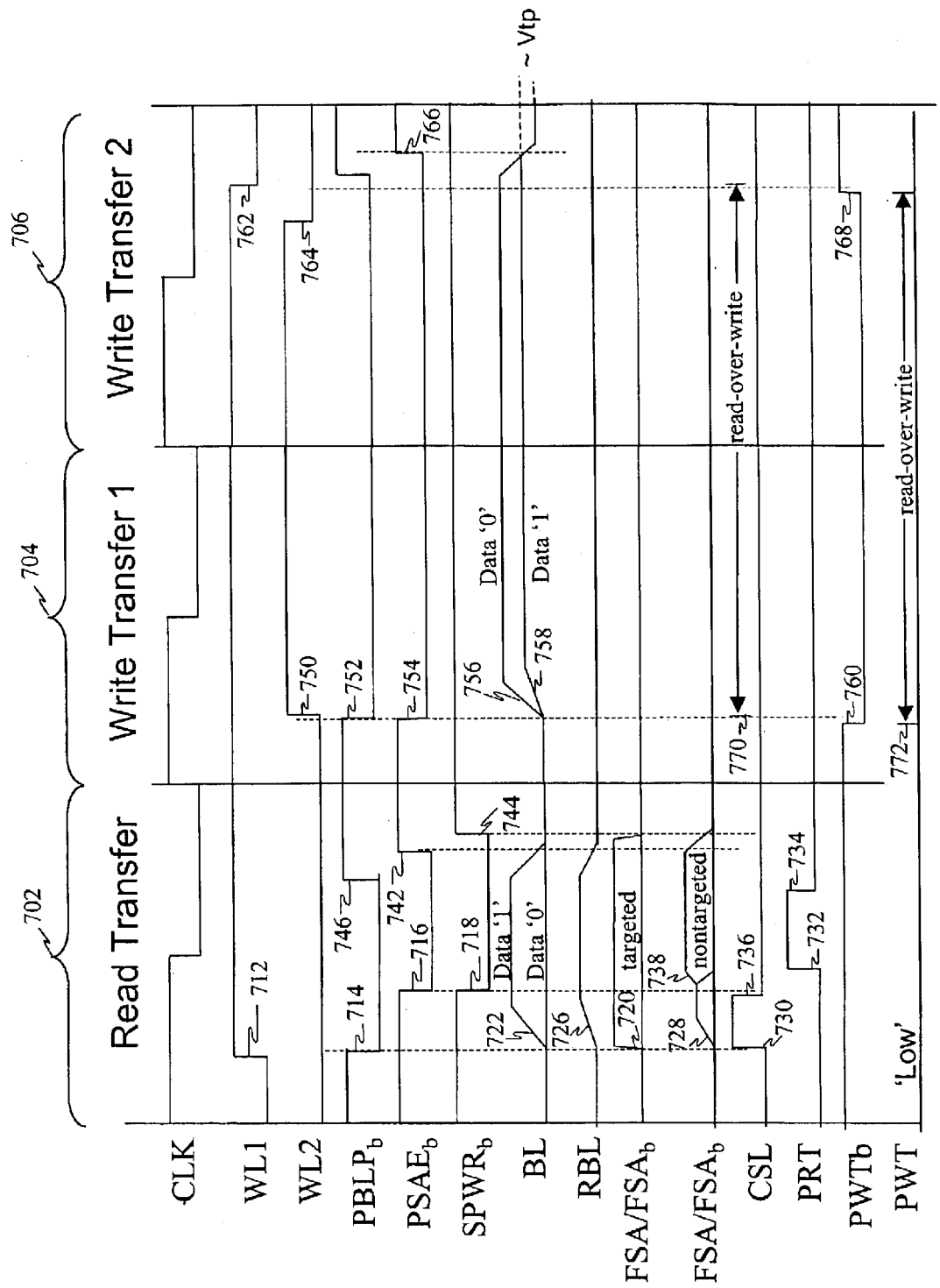
FIG. 7 is a timing diagram illustrating timing sequences and control signal relationships when performing a memory access-related operation with the exemplary write access circuit of FIG. 6.

FIG. 7 is a timing diagram illustrating exemplary timing sequences and control signal relationships when activating and deactivating circuit elements of exemplary circuit 501 of FIG. 5, in accordance with a specific embodiment of the present invention. FIG. 7 also depicts timing and levels of circuit elements acted upon by the control signals, such as bit lines BL 503 and reference bit line RBL 505, nodes FSA and $FSA_b$, etc. The following discussion in connection with FIG. 7 describes the timing associated first with a write operation, and then second with a read-over-write operation.

Prior to an exemplary write operation (i.e., prior to edge 712 in FIG. 7) WL1 is deactivated so that device 506 isolates device 504 from bit line BL 503, and control signal $PBLP_b$ is activated so that devices 570 and 572 can pre-charge bit line BL 503 and reference bit line RBL 505. In some embodiments, pre-charging takes bit line 503 and reference bit line 505 to or near ground (i.e., 0 mV). Further, $PSAE_b$ is activated so that device 514 couples bit line 503 to node FSA 536 and so that device 550 couples reference bit line 505 to node $FSA_b$ 538. Additionally, sense amplifier control signal $SPWR_b$ is in a state until edge (i.e., signal transition) 718 that disables operation of the sense amplifier. Finally, CSL is not activated so that devices M13 and M14 respectively decouple nodes FSA 536 and $FSA_b$ 538 from input/output lines IO and $IO_b$.

An exemplary write operation commences during a read transfer cycle 702. At or near edge 712 of FIG. 7, word line one ("WL1") is activated to read a data signal representing a stored unit of data onto bit line 503 of FIG. 5. Simultaneous to, or before edge 714, $PBLP_b$ is deactivated so that devices 570 and 572 are isolated from bit line 503 and reference bit line 505 to end the pre-charging cycle. At or near edge 714, signal CSL is activated at edge 730 for writing data to a specifically targeted cell, whereas signal CSL is not activated for those bit lines associated with memory cells 502 that are not targeted for receiving external program data.

During a write operation associated with targeted and nontargeted cells (in read transfer cycle 702), FIG. 7 shows that at or near edge 722 bit line 503 begins charging to a voltage level commensurate with the data signal representing the data stored in memory cell 502 of FIG. 5. Similarly, FIG. 7 shows that at or near edge 726 reference bit line 505 begins charging to a voltage level commensurate with the reference data signal representing the reference voltage generated by reference cell 552. In particular, the data signal read from a memory cell 502 provides either a voltage representing logical one (i.e., Data '1') or logical zero (i.e., Data '0'), and the reference signal on reference bit line provides a predetermined reference voltage.

Since signal CSL is not activated with regard to nontargeted memory cells, a nontargeted memory cell 502 along with a reference cell 552 respectively provide voltage levels to nodes FSA 536 and $FSA_b$ 538, rather than receiving an external write data signal driven via input/output lines IO and $IO_b$ (as is the case with targeted memory cells). Signal transition 728 represents the magnitude of the reference signal over time at node $FSA_b$ 538, such as about 100 mV. Although not shown, but at about the same time as signal transition 728 occurs, node FSA 536 rises to a voltage level equivalent to either a logical one, such as 200 mV, or a logical zero, such a 0 mV.

In contrast to write operations with nontargeted cell 502, during a write operation associated with a targeted memory cell 502, at or near edges 722 and 726, bit line 503 and reference bit line 505 are respectively driven to voltages representing complementary logical states (not shown). For example, at edge 722 if bit line 503 is driven to $V_{DD}$, then at edge 726 reference bit line 505 is driven to ground. Signal transition 720 represents the complementary logical states at nodes FSA 536 and $FSA_b$ 538 driven via input/output lines IO and $IO_b$ while signal CSL is activated for a time interval defined from signal transition 730 to signal transition 736. The data bit in this case can be said to have been prepared for transfer to write access circuit 580 for writing to memory cell 502

Near or after CSL returns to an deactivated state at edge 736 and near or at near transition 716 control signal $PSAE_b$ deactivates devices 514 and 550 to isolate the sense amplifier prior to or during sense amplification. Also, control signal $SPWR_b$ at or near transition 718 activates the sense amplifier, which in turn begins resolving the data signal applied to node FSA 536 into a voltage representing either a logical one or zero. The data bit is thus prepared for transfer to write access circuit 580 for writing to memory cell 502.

Regarding targeted memory cells 502, the waveforms beginning at edge 720, illustrate the complementary magnitudes of logical states at nodes FSA 536 and $FSA_b$ 538 of write data to be programmed into the target memory cells 502. That is, the waveforms represent complementary magnitudes of write data driven along IO and $IO_b$ to nodes FSA 536 and $FSA_b$ 538, respectively, to either $V_{DD}$ or ground, for example. In contrast, the stored data from nontarget memory cells, as resolved by the sense amplifier, are represented by the waveforms beginning at signal transition 738. At 738, complementary magnitudes of the stored data are resolved by the sense amplifier at nodes FSA 536 and $FSA_b$ 538, respectively, to either $V_{DD}$ or ground, for example.

After nodes FSA 536 and $FSA_b$ 538 are set up (i.e., prepared) with data at edge 738, driver-register 580 operates to receive the data to be written into the memory cell 502 beginning at signal transition 732 and ending at signal transition 734 of the read transfer control signal ("PRT"). The read transfer control signal, for example, is applied to transfer circuit 624 of FIG. 6 for transferring the write data to driver-register 618 for storage. At signal transitions 744, 742 and 746, the read transfer cycle comes to an end by respectively deactivating the sense amplifier, coupling node FSA 536 to bit line 503 and node $FSA_b$ 538 to reference bit line 505, and pre-charging bit line 503 and reference bit line 505.

A write transfer cycle 704 of FIG. 7 follows read transfer cycle 702. The transfer of data includes isolating targeted and non-targeted memory cells 502 from the sense amplifier inputs by disabling devices 514 and 550 at edge 754. Write transfer cycle 704 also includes disabling devices 570 and 572 at edge 752 to halt the pre-charging of bit line 503 and reference bit line 505. Thereafter, circuit 501 of FIG. 5 is in condition to program a memory cell 502.

At signal transition 760, write transfer control signal ("$PWT_b$") initiates the driving of write data onto bit line BL 503. For example, if the write data represents a logical zero (i.e., Data '0'), then the magnitude of the write signal is a relatively high voltage, such as $V_{DD}$. If, however, the write data represents a logical one (i.e., Data '1'), then the magnitude of the write signal is a relatively low, but adjusted voltage, such as $V_{Tp}$. As shown in FIG. 7, magnitudes of write data representing logical zero and one are respectively illustrated as transitioning at 756 and 758. In one embodiment, adjuster 616 of FIG. 6 drives the write data onto bit line 503 in response to $PWT_b$.

At signal transition 750, WL2 is activated to begin programming the targeted and nontargeted memory cells associated with the selected word line WL2. In some embodiments, additional write transfer cycles can be implemented to ensure data is properly written into memory cells 502. For example, in memory applications where the clock signal CLK is operating at a relatively high speed, such as above 400 MHz, then write transfer cycle 706 (or additional write transfer cycles) in addition to write transfer cycle 704 can be used for proper programming. The additional write transfer cycles are added to ensure that sufficient time is allotted for allowing TCCT-based memory cells 502 to accept the write data. In this instance, write transfer cycle 706 is enough time for each memory cell 502 to be properly programmed.

To end the write operation, signal $PWT_b$ deactivates driver-register 580 after or near signal transition 768. At transition 764, word line WL2 signal is in a state that deactivates the programming capability of the TCCT device of memory cell 502. At edge 762, word line WL1 signal is in a state to isolate memory cells 502 from bit line BL 503, such as by deactivating device 506. The write operation concludes when, at signal transition 766, control signal $PSAE_b$ accompanies control signal $PBLP_b$ to pre-charge bit line 503 and reference bit line 505.

A read-over-write operation can also be described with respect to the exemplary timing diagram of FIG. 7. An example of a read-over-write operation is a situation where a read operation is requested during the pendency of a write operation where the read operation is designed to supersede the write operation. Accordingly, if a read-over-write operation is invoked during a read transfer cycle of a write operation, the read transfer cycle can be halted before finishing; the data to be read can be accessed directly from the targeted memory cell 502. If a read-over-write operation, however, is invoked after a write transfer cycle has begun, and more specifically, after word line WL2 activates the programming mode of the TCCT-based memory cells subject to the read-over-write, the data stored therein are not reliable. Therefore, the requested data should be accessed from driver-register 580.

To read the requested data in the read-over-write operation, control signal CSL and writer transfer signal PWT are used to transfer the write data stored in driver-register 580 via input/output lines IO and $IO_b$ to an external source requesting the data. Unlike the write operation described above, write transfer signal PWT is used during a time period demarcated at 772 to activate, for example, NMOS component M19N of exemplary adjuster 616 of FIG. 6. Activation of M19N allows driver-register 580 of FIG. 5 to overdrive residual charge, if any, on bit line 503 for expedited reading of the data, and to reprogram the memory cell 502 with the previously stored data. Control signal CSL is used during a time period highlighted at 770 to allow the data to be driven external to the memory array in which memory cell 502 resides. In some memory applications, such as those running at clock speeds of less than 400 MHz, expedited writing and reading of data is not critical.

In some embodiments, a read transfer cycle follows the interrupted write cycle during a read-over-write operation (not shown). This read transfer cycle includes accessing the write data from the driver-register circuit and then resolving the write data with the sense amplifier before driving it out of the memory array. In one or more embodiments, an inverter device (not shown) is coupled to at least one input/output line IO during a read-over-write operation to translate the write data having a magnitude complementary to the actual write data.

Figure 8:
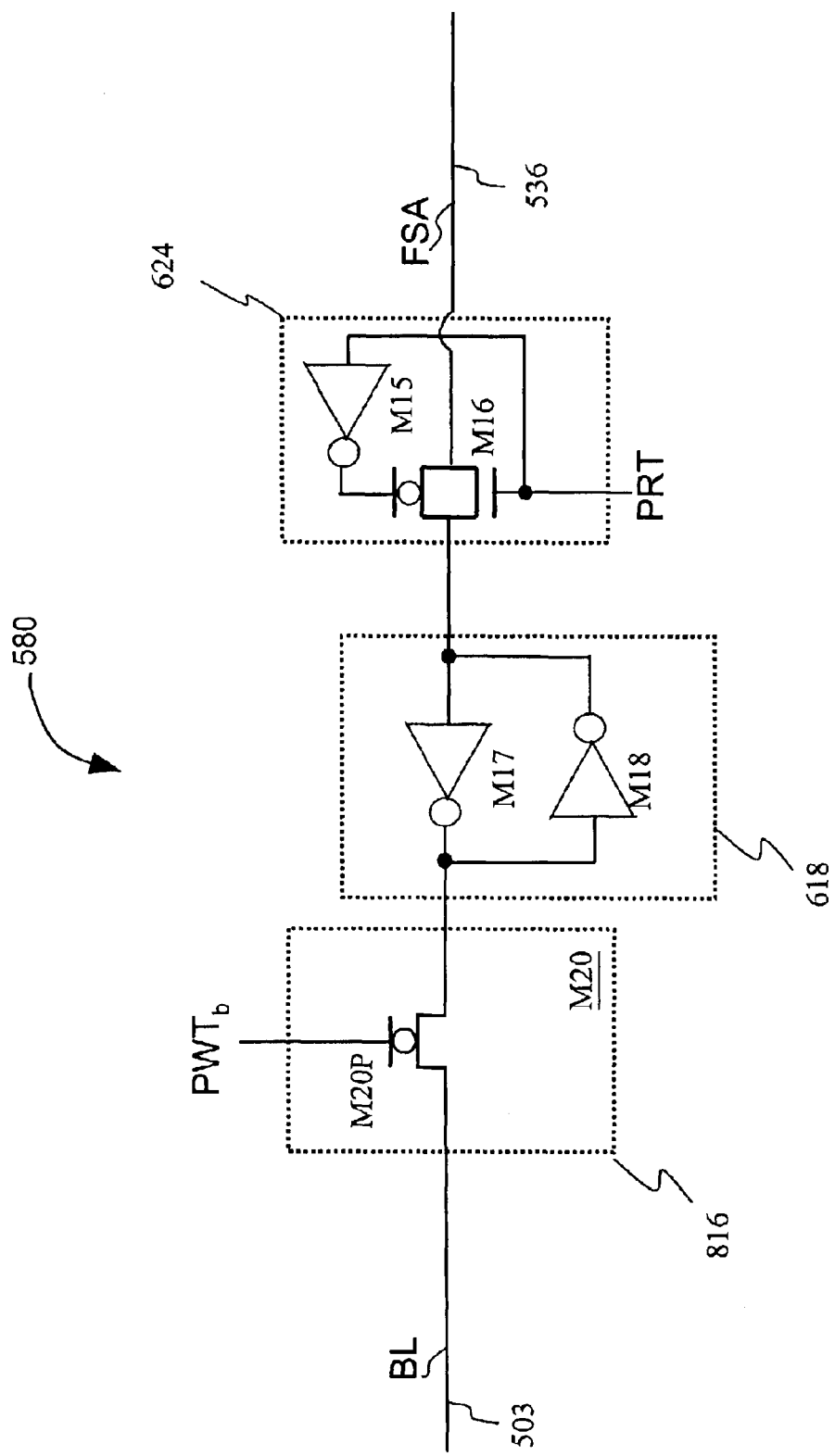
FIG. 8 is a schematic circuit diagram of an exemplary write access circuit in accordance with another embodiment of the present invention.

FIG. 8 is a schematic diagram of an exemplary write data circuit 580 according to another specific embodiment of the present invention. In this instance, write data circuit 580 is designed to operate in less speed critical applications. Write data circuit 580 includes a transfer circuit 624 and a driver-register circuit 618, both of which are similar in structure and functionality of those described in connection with FIG. 6.

Exemplary adjuster 816 of FIG. 8 includes a PMOS device M20P rather than a transmission gate 719, which additionally includes a NMOS device. Although adjuster 816 operates similarly to adjuster 616 of FIG. 6 during a write operation, adjuster 816 adjusts the magnitude for a write data signal during a read-over-write operation. Adjuster 816 therefore can be adapted to be used in applications that operate at relatively slow speeds, especially in regard to memory access time. Hence, given sufficient time (i.e., time for activating the write transfer control signal), adjuster 816 can eventually over-drive residual charge on bit line 503 to provide write data at relatively slow clock speeds, such as below 400 MHz.

Figure 9:
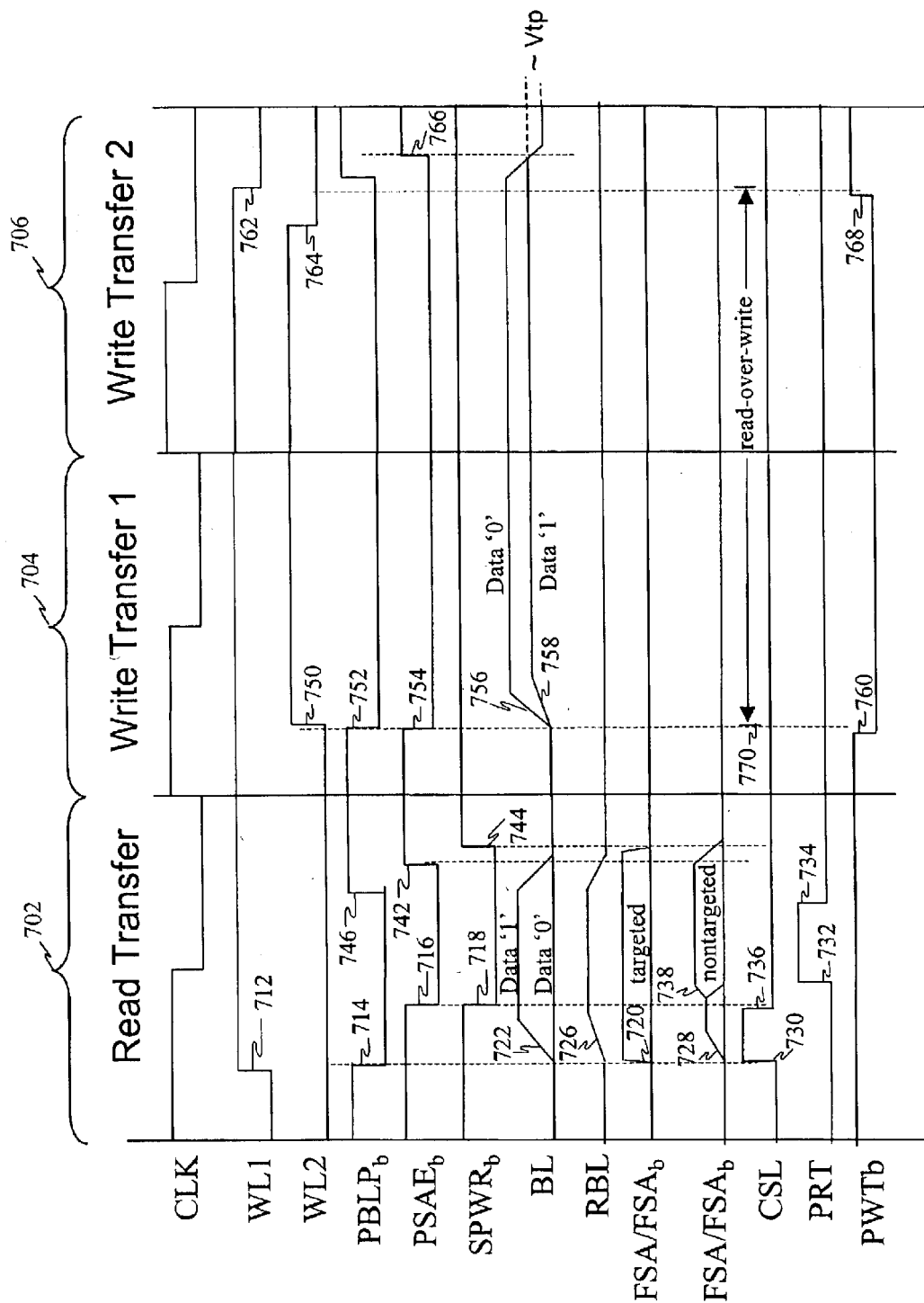
FIG. 9 is a timing diagram illustrating timing sequences and control signal relationships when performing a memory access-related operation with the exemplary write access circuit of FIG. 8.

FIG. 9 is a timing diagram illustrating an exemplary timing sequence and control signal relationships when activating and deactivating circuit elements of exemplary circuit 501 of FIG. 5, in accordance with a specific embodiment using adjuster 816 of FIG. 8. The signals and signal transitions of FIG. 9 are similar to that of FIG. 7, except write transfer signal PWT is absent and that $PWT_b$ need only be active during one write transfer cycle 704 since the clock speed is decreased.

Figure 10:
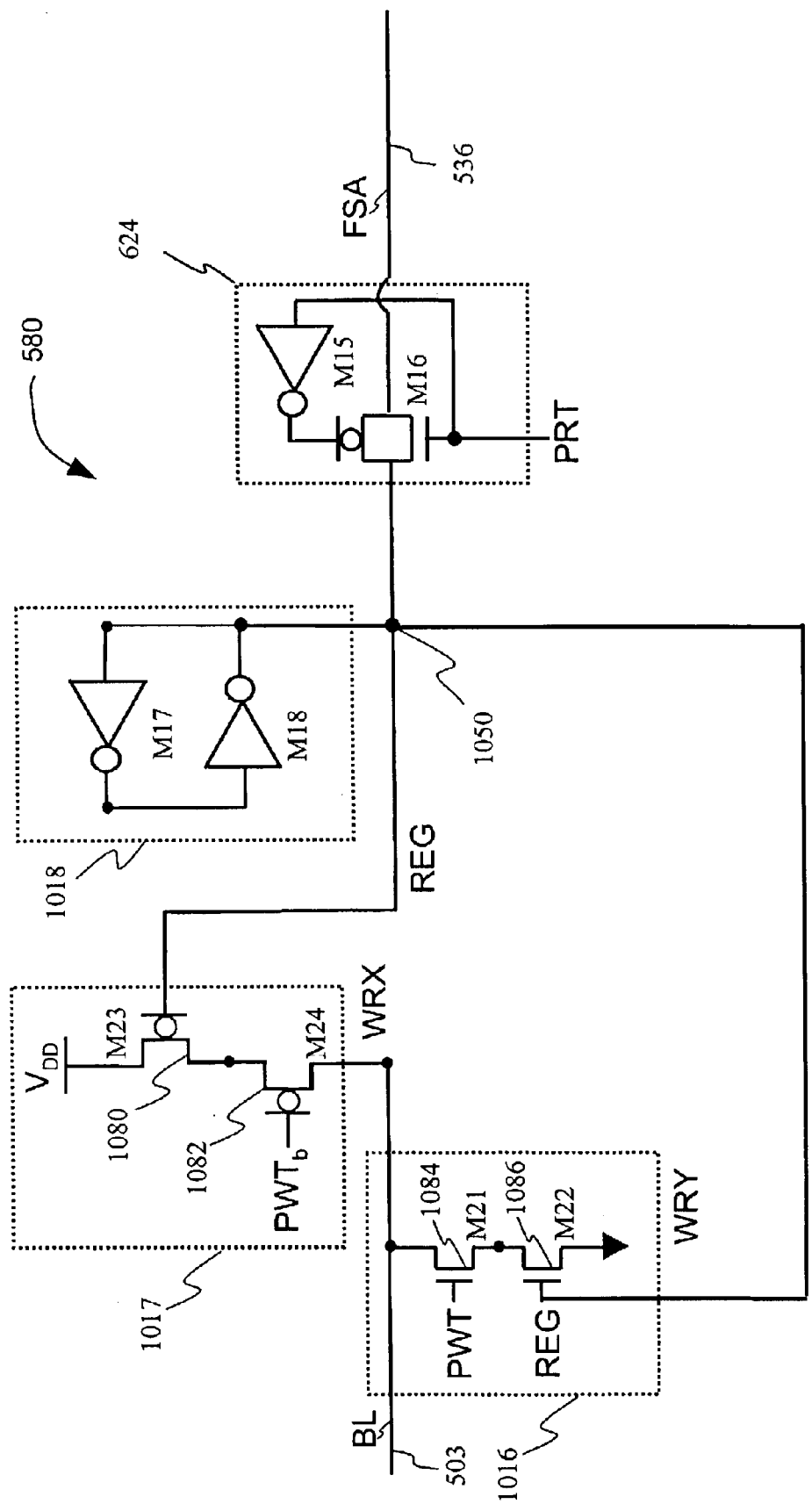
FIG. 10 is a schematic circuit diagram of an exemplary write access circuit in accordance with yet another embodiment of the present invention.

FIG. 10 is a schematic diagram of an exemplary write data circuit 580 in accordance with yet another specific embodiment of the present invention. Exemplary write data circuit 580 of FIG. 10 includes a transfer circuit 624, which is similar in function and structure of that described in connection with FIG. 6. Exemplary write data circuit 580 includes an exemplary driver-register 1018, a write X ("WRX") circuit 1017 and a write Y ("WRY") circuit 1016. Driver-register 1018 includes an inverter M17 having an input connected to storage node REG 1050, and an output coupled to an input of inverter M18. Moreover, inverter M18 has an output connected to REG 1050. In operation, driver-register 1018 stores write data transferred from node FSA 536.

WRX circuit 1017 and WRY circuit 1016 operate to drive bit line 503 to a logic level complementary to the write data stored in driver-register 1018. WRX circuit 1017 includes a PMOS device M23 1080 having a source terminal connected to $V_{DD}$ and a gate connected to REG 1050. WRX circuit 1017 also includes a PMOS device M24 1082 having a gate configured to receive write transfer signal $PWT_b$, a drain terminal connected to bit line 503, and a source terminal connected to a drain terminal of device 1080. In this instance, if the data is a logical zero and has a magnitude of about 0 mV, then WRX circuit 1017 will drive write onto bit line 503 when $PWT_b$ is low. More specifically, if a logical zero is transferred from node FSA 536 into driver-register 1018, then REG 1050 will have a magnitude of about 0 mV. With device 1080 activated, bit line 503 will couple (i.e., drive) to $V_{DD}$ when device 1082 is also activated.

Similarly, WRY circuit 1016 includes an NMOS device M22 1086 having a source terminal connected to ground and a gate connected to REG 1050. WRY circuit 1016 also includes an NMOS device M21 1084 having a gate configured to receive write transfer signal PWT, a drain terminal connected to bit line 503, and a source terminal connected to a drain terminal of device 1086. In this instance, if the data is a logical one and has a magnitude of about 1.2 V, then WRY circuit 1016 will drive write data onto bit line 503 when PWT is high. More specifically, if a logical one is transferred from node FSA 536 into driver-register 1018, then REG 1050 will have a magnitude of about 1.2 V. With device 1086 activated, bit line 503 will couple (i.e., drive) to ground when device 1084 is also activated.

Figure 11:
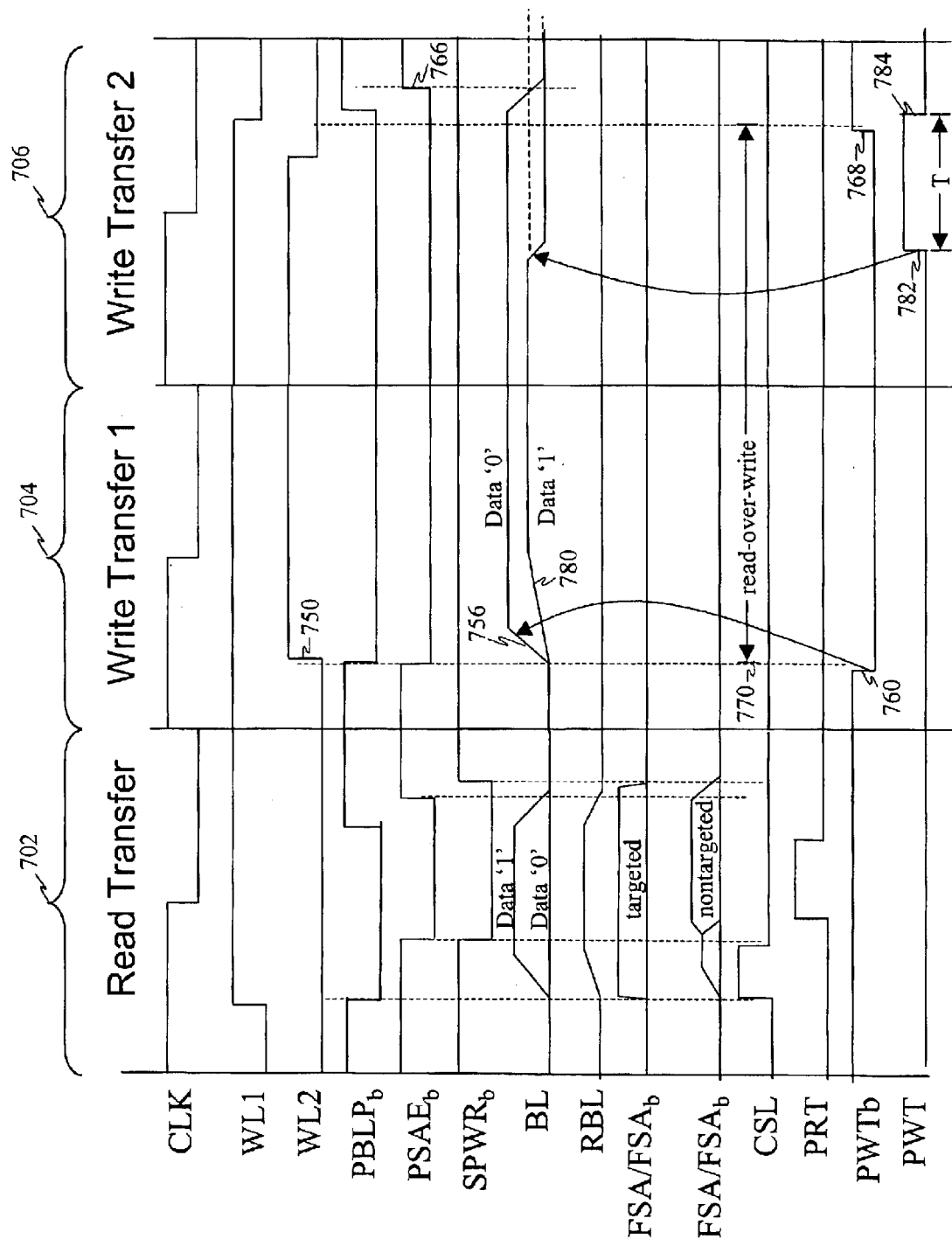
FIG. 11 is a timing diagram illustrating timing sequences and control signal relationships when performing a memory access-related operation with the exemplary write access circuit of FIG. 10.

FIG. 11 is a timing diagram illustrating exemplary timing sequences and control signal relationships, in accordance with a specific embodiment using exemplary write access circuit 580 of FIG. 10. Although read transfer cycle 702 of FIG. 11 is similar to that of FIG. 7, the write transfer cycles shown in FIG. 11 are adapted to reflect the functionality of write access circuit 580 of FIG. 10. The following two write operations that use write access circuit 580 of FIG. 10 illustrate the pertinent signal transitions in relation to the logical state of the write data to be programmed into either a targeted or nontargeted cell.

First, a write operation where a logical zero is transferred from node FSA 536 onto REG 1050 will be discussed. When write transfer control signal $PWT_b$ transitions to a low state at signal transition 760, device 1082 is activated. In response, bit line 503 couples to $V_{DD}$ at edge 756. Therefore, a logical zero is programmed via bit lines 503 into an associated memory cell 502. A logical zero will be programmed when word line WL2 is in a state indicated at signal transition 750 and bit line 503 is at a relatively high voltage. It should be noted that WRY circuit 1016 does not operate to pull bit line 503 down to ground when KEG 1050 stores a write data magnitude representing a logical zero (i.e., REG has a voltage about 0 mV). Although write transfer control signal PWT transitions to a high state at edge 782 to activate device 1084, device 1086 remains deactivated due to the low state of signal PWT.

Next, a write operation will be described where a logical one is transferred from node FSA 536 onto REG 1050, and where a write data magnitude of about 1.2 V represents the logical one. With REG 1050 at a relatively high voltage, device 1084 activates when write transfer control signal PWT transitions to a high state at signal transition 782. In response, bit line 503 couples to about ground at edge 780. Therefore, a logical one is programmed into an associated memory cell 502 when WL2 is in a state indicated at signal transition 750. WRX circuit 1016, however, will not operate to pull bit line 503 up to $V_{DD}$. Although write transfer control signal $PWT_b$ transitions to a low state at edge 760 to activate device 1082, a write data magnitude of about 1.2 V on REG 1050 prevents activation of device 1080. Consequently, bit line 503 is not pulled up to $V_{DD}$.

To minimize power consumption, the duration that write transfer signal, PWT is in a state that provides a shortened time period that a current path to ground exists. In particular, the time interval "T" from the rising edge 782 of PWT to the falling edge 784 of PWT can be selected so as to minimize power consumption to an appropriate amount, especially over time. For example, time interval "T" of FIG. 11 can be set to about 1 nS to sufficiently program a logical one into a memory cell without needlessly consuming power.

In the event a read-over-write operation is invoked, write access circuit 580 of FIG. 10 is used similar to other embodiments that are described herein. It should be noted that in some embodiments, a read-over-write operation in connection with FIG. 11 includes an access to the write access circuit 580 of FIG. 10 when write transfer signals $PWT_b$ and PWT occur at the same, such as after transition 782.

Figure 12:
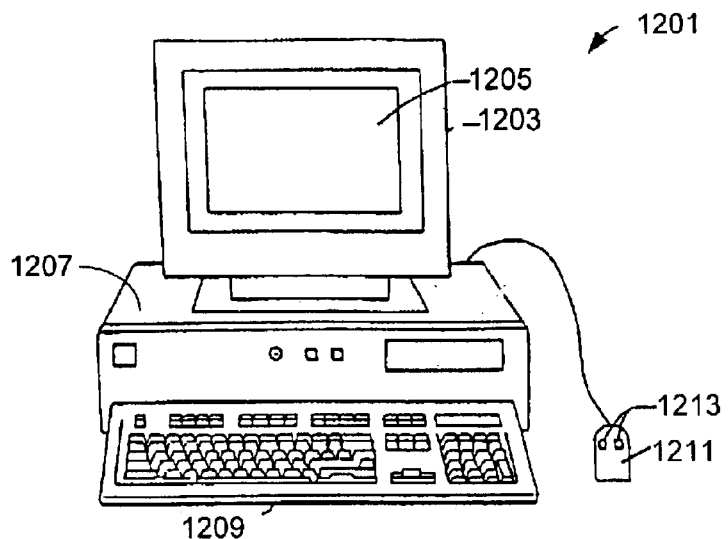
FIG. 12 is an illustration of an exemplary computing device in accordance with an embodiment of the present invention.
Figure 13:
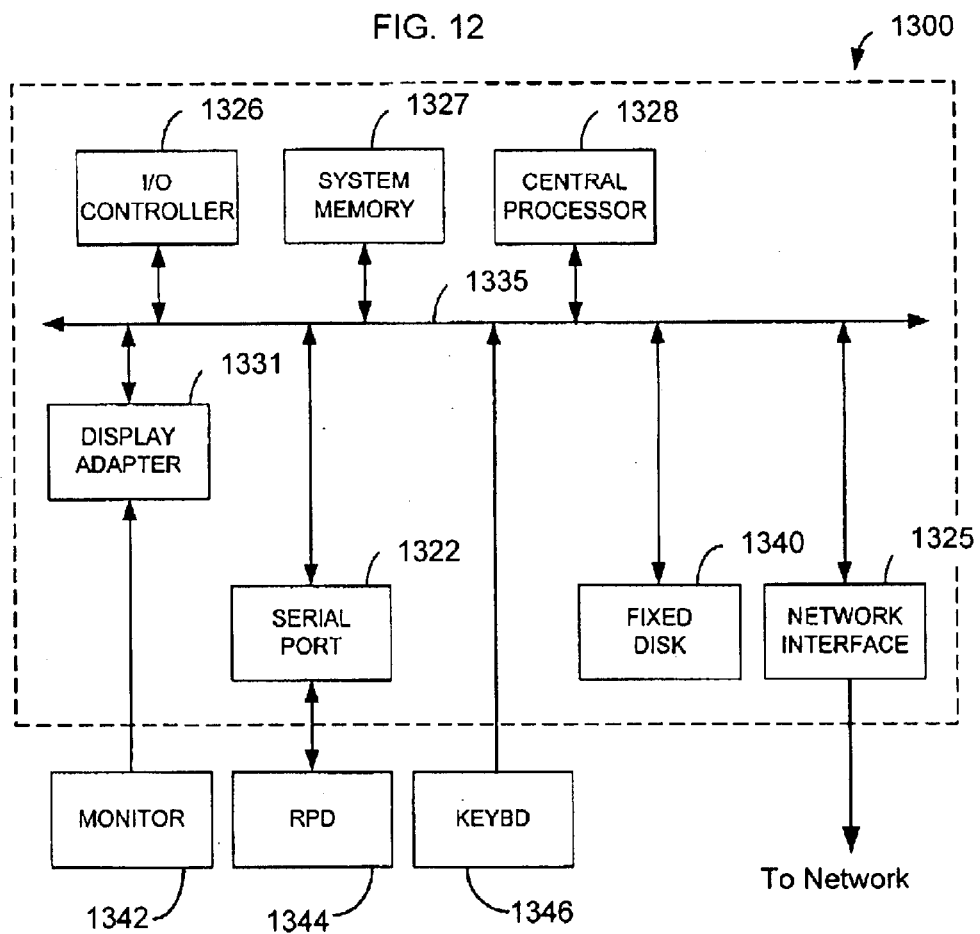
FIG. 13 illustrates an exemplary subsystem of the computing device of FIG. 12 according to an embodiment of the present invention.

FIGS. 12 and 13 illustrate basic hardware components suitable for practicing embodiments of the present invention. FIG. 12 is an illustration of an exemplary computing device 1201 including display 1203 having display screen 1205. Cabinet 1207 houses standard computer components such as a disk drive, CD ROM drive, display adapter, network card, random access memory (RAM), central processing unit (CPU), and other components, subsystems and devices. User input devices such as mouse 1211 having buttons 1213, and keyboard 1209 are shown. Other user input devices such as a trackball, touch-screen, digitizing tablet, voice or visual recognition, etc. can be used. In general, the computer system is illustrative of but one type of computer system, such as a desktop computer, suitable for use with the present invention. Computing devices can be configured with many different hardware components and can be made in many dimensions and styles (e.g., laptop, palmtop, pentop, server, workstation, mainframe, etc.). Any hardware platform suitable for performing the processing (e.g., wireless communication devices, etc.) described herein is suitable for use with the present invention.

FIG. 13 illustrates typical subsystems found in computing devices such as computing device 1201. Such subsystems typically are contained within the computer system such as within cabinet 1207 of FIG. 12. In FIG. 13, subsystems within box 1300 are directly interfaced to internal bus 1335. Subsystems include input/output (I/O) controller 1326, System Memory (including various types of random access memory "RAM," such as Static RAM or "SRAM") 1327, central processing unit CPU 1328, Display Adapter 1331, Serial Port 1322, Fixed Disk 1340, Network Interface Adapter 1325 (e.g., Network Interface Card, or NIC), which in turn is configured to communicate with a network, such as by electrical, radio, or optical means known in the art. The use of bus 1335 allows each of the subsystems to transfer data among subsystems and, most importantly, with the CPU, where the CPU might be a Sparc™, an Intel CPU, a PowerPC™, or the equivalent. External devices can communicate with the CPU or other subsystems via bus 1335 by interfacing with a subsystem on the bus. Thus, Monitor 1342 connects with Display Adapter 1331, a relative pointing device ("RPD") 1344, such as a mouse 1211, connects through a port, such as Serial Port 1322. Some devices such as Keyboard 1346 can communicate with the CPU by direct means without using the main data bus as, for example, via an interrupt controller and associated registers.

As with the external physical configuration shown in FIG. 12, many subsystem configurations are possible. FIG. 13 is illustrative of but one suitable configuration. Subsystems, components or devices other than those shown in FIG. 13 can be added, and a suitable computing device can also be achieved using fewer than all of the sub-systems shown in FIG. 13. For example, a standalone computer that is not coupled to a network does not require Network Interface 1325. Other subsystems such as a CD ROM drive, graphics accelerator, etc. can be included in the configuration without affecting the performance of the system of the present invention.

Although the present invention has been discussed with respect to specific embodiments, one of ordinary skill in the art will realize that these embodiments are merely illustrative, and not restrictive, of the invention. For example, although the above description describes an exemplary memory cell as a TCCT-based memory cell, it should be understood that the present invention relates to any memory cell type in general and need not be restricted to use in TCCT memory arrays. For example, Magnetoresistive Random Access Memory ("MRAM"), Ferroelectric Random Access Memory ("FRAM"), SRAM, DRAM, and other memory types can be used in the circuit and method described herein.

Additionally, the disclosed circuit and method can be modified to accommodate the specific memory type. Moreover, any memory type can provide a basic structure for a reference memory cell in which a memory cell is compared thereto. Although embodiments of the circuit and method of the present invention are described in the context of an open-bit line architecture, any other suitable architecture can be used to practice the present invention. Furthermore, although the various embodiments of the circuit and method of the present invention are described in the context of CMOS technologies, one having ordinary skill in the art should be able to readily adapt the various disclose embodiments into other known technologies. It should be noted that the values of relatively high and low voltage (e.g., VDD, ground) and intermediate voltages and polarities are illustrative and other voltages and reversed polarities are within the scope and spirit of the present invention.

Various features and aspects of the above-described invention maybe used individually or jointly. Further, the invention can be utilized in any number of environments and applications beyond those described herein without departing from the broader spirit and scope of the specification. The specification and drawings are, accordingly, to be regarded as illustrative rather than restrictive. The scope of the invention is not limited to the described embodiments and is to be determined solely by the appended claims.

What is claimed is:

1. A memory device for storing one or more data bits, each of the one or more of the data bits is associated with a first logic state magnitude to represent a first logic state and a second logic state magnitude to represent a second logic state, the memory device comprising:

a memory cell configured to store a first data bit; and a write access circuit coupled to the memory cell for providing a write data bit having a write data bit magnitude, the write access circuit configured to adjust the write data bit magnitude to an intermediate logic state magnitude in a memory operation.

2. The memory device of claim 1, wherein the memory cell includes a negative differential resistance device.

3. The memory device of claim 1, wherein the memory cell includes a thinly capacitively-coupled thyristor (TCCT) device.

4. The memory device of claim 1, wherein the write access circuit adjusts the write data bit magnitude for only one of either the first logic state or the second logic state associated with the write data bit.

5. The memory device of claim 1, wherein the internal logical state magnitude represents either the first logic state or the second logic state, the intermediate logic state magnitude being between that of the first logic state magnitude and the second logic state magnitude.

6. The memory device of claim 5, wherein the internal logical state magnitude is approximately 0.3 volts, the first logic state is approximately 1.2 volts and the second logic state is approximately 0.0 volts.

7. The memory device of claim 1, wherein the intermediate logic state magnitude in the memory operation provides for a reduction in power consumed by the memory device during the memory operation.

8. The memory device of claim 1, wherein the memory operation is a write operation.

9. The memory device of claim 8, wherein the write data bit is the first data bit, which is transferred from the memory cell to the write access circuit for preserving a stored data bit of the memory cell.

10. The memory device of claim 9, wherein the first data bit is transferred from the memory cell to the write access circuit during a first portion of the write operation.

11. The memory device of claim 8, wherein the write data bit is a second data bit, which is transferred from other than the memory device to the write access circuit for replacing a stored data bit of the memory cell.

12. The memory device of claim 11, wherein the write data bit is transferred from other than the memory cell during a first portion of the write operation.

13. The memory device of claim 12, wherein the write data bit is programmed into the memory cell during a second portion of the write operation.

14. The memory device of claim 13, wherein the second portion of the write operation is configurable to have a greater duration of time than the first portion.

15. The memory device of claim 14, wherein the duration of time of the second portion is related to a frequency of operation of the memory device.

16. The memory device of claim 1, wherein the write access circuit is further configured to adjust the write data bit magnitude to either the first logic state magnitude or the second logic state magnitude in another memory operation.

17. The memory device of claim 16, wherein the another memory operation is a read-over-write operation.

18. The memory device of claim 17, wherein the adjusted write data bit magnitude represents the first data bit and is available to be output from external to the memory device.

19. The memory device of claim 1, wherein the write access circuit further comprises:

a transfer circuit configured to receive the write data bit;

a driver register circuit coupled to the transfer circuit, where the driver register circuit is configured to store and to drive the write data bit; and an adjuster circuit coupled to the driver register circuit, where the adjuster circuit is configured to adjust the write data bit magnitude.

20. A write access circuit for programming a memory cell during a write operation, the write access circuit comprising:

a transfer circuit configured to transfer a data bit during a first portion of the write operation;

a driver register circuit configured to store the data bit and to drive a write data bit, and including an output, and an input coupled to the transfer circuit to receive the data bit; and an adjuster circuit coupled to the output of the driver register circuit, and is configured to adjust a characteristic of the write data bit during a second portion of the write operation.

21. The write access circuit of claim 20, wherein the data bit is transferred either from the memory cell if the memory cell is a nontargeted memory cell or from a source other than the memory cell if the memory cell is a targeted memory cell.

22. The write access circuit of claim 20, wherein the characteristic adjusted is a write data magnitude.

23. The write access circuit of claim 22, wherein the write data bit magnitude represents a complement of the data bit.

24. The write access circuit of claim 22, wherein the transfer circuit further comprises:

a transmission gate having an input configured to receive the data bit, a first control input, a second control input and an output;

an inverter having an input coupled to the first control input, and an output coupled to the second control input.

25. The write access circuit of claim 24, wherein the transfer circuit is responsive to a read transfer control signal applied to the first control input during the first portion of the write operation.

26. The write access circuit of claim 22, wherein the driver register circuit further comprises:

a first inverter having an input configured to receive the data bit and an output configured to drive the write data bit; and a second inverter having an output coupled to the input of the first inverter, and an input of coupled to the output of the first inverter.

27. The write access circuit of claim 22, wherein the adjuster circuit further comprises a transmission gate including an input, a first control input, a second control input and an output, where the input of the transmission gate is coupled to the driver register circuit for receiving the write data bit, and the output of the transmission gate is coupled to the memory cell.

28. The write access circuit of claim 27, wherein the first control input receives a write transfer control signal during the second portion of the write operation.

29. The write access circuit of claim 27, wherein the transmission gate is a CMOS transmission gate comprising a PMOS device having a gate configured to operate as the first control input, and having a threshold voltage configurable to provide the adjusted write data bit magnitude.

30. The write access circuit of claim 29, wherein the threshold voltage is set to approximately 0.3 volts.

31. The write access circuit of claim 29, wherein the transmission gate is a CMOS transmission gate further comprising an NMOS device having a gate configured to operate as the second control input.

32. The write access circuit of claim 31, wherein during a read-over-write operation the gate of the PMOS device receives a first control signal and the gate of the NMOS device receives a second control signal.

33. The write access circuit of claim 27, wherein the adjuster circuit is a PMOS device having a gate configured to operate as the first control input, and having a threshold voltage configurable to provide the adjusted write data bit magnitude.

34. The write access circuit of claim 20, wherein the characteristic that is adjusted is a period of time that the write data bit is applied to the memory cell.

35. The write access circuit of claim 34, wherein the transfer circuit further comprises:
   a transmission gate having an input configured to receive the data bit, a first control input, a second control input and an output;
   an inverter having an input of the inverter coupled to the first control input, and an output coupled to the second control input.

36. The write access circuit of claim 34, wherein the driver register circuit configured to store the data bit, and further comprises:
   a first inverter having an input configured to receive the data bit and an output; and
   a second inverter having an input coupled to the output of the first inverter and an output coupled to the input of the first inverter.

37. The write access circuit of claim 34, wherein the adjuster circuit further comprises:
   a first write circuit configured to provide the write data bit having a first write data logic state complimentary to a first data bit logic state associated with the data bit; and
   a second write circuit configured to provide the write data bit having a second write data logic state complimentary to a second data bit logic state associated with the data bit.

38. The write access circuit of claim 37, wherein the first write circuit further comprises:
   a first PMOS device having a gate terminal configured to receive the data bit and a source terminal coupled to a relatively high potential; and
   a second PMOS device having a gate terminal configured to receive a complementary write transfer control signal, a source terminal coupled to a drain terminal of the first PMOS, and a drain terminal configured to provide the write data bit having the first write data logic state.

39. The write access circuit of claim 37, wherein the second write circuit further comprises:
   a first NMOS device having a gate terminal configured to receive the data bit and a source terminal coupled to a relatively low potential,
   a second NMOS device having a gate terminal configured to receive a write transfer control signal, a source terminal coupled to a drain terminal of the first NMOS, and a drain terminal configured to provide the write data bit having the second write data logic state.

40. The write access circuit of claim 39, wherein the write data having the second write data logic state is provided to the memory cell only during the period of time that the write transfer control signal is applied to the second NMOS device so as to limit power consumption.

41. A method for accessing a memory cell in performing a write operation, the method comprising:
   preparing a data bit for programming a memory cell, the data bit having a data bit magnitude associated with a first logic state magnitude to represent a first logic state and a second logic state magnitude to represent a second logic state;
   storing the data bit;
   translating the data bit magnitude to a write data bit magnitude, where the write data magnitude is used to program the data bit into the memory cell; and
   adjusting the write data bit magnitude associated with at least one of either the first logic state or the second logic state.

42. The method of claim 41, further comprising reducing a voltage drop across the memory cell in proportion with the adjusting of the write data bit magnitude.

43. The method of claim 41, wherein preparing the data bit further comprises reading the stored data bit from the memory cell, if the memory cell is not selected for programming.

44. The method of claim 41, wherein preparing the data bit further comprises providing the data bit from an external source, if the memory cell is selected for programming.

45. The method of claim 41, further comprising applying the adjusted write data bit magnitude to the memory cell for storing the data bit.

46. The method of claim 45, further comprising:
   interrupting the application of the adjusted write data to perform a read operation; and
   transmitting the stored data bit to an external source that is requesting the data bit.

47. The method of claim 41, wherein the write data magnitude is adjusted from 0 volts to a range of 0.2 volts to 0.6 volts.

48. A computing device comprising:
   a central processing unit (CPU) configured to retrieve a data bit during a read operation and to provide the data bit during a write operation; and
   a memory device coupled to the CPU, where the memory device is configured to store the data bit, the memory device comprising
   a memory cell configured to store a stored data bit;
   a transfer circuit configured to transfer either the data bit or the stored data bit during a first portion of the write operation a data bit,
   a driver register circuit including an output, and an input coupled to the transfer circuit to receive either the data bit or the stored data bit, where the driver register circuit is configured to store either the data bit or the stored data bit and to drive a write data bit, and
   an adjuster circuit coupled to the output of the driver register circuit, where the adjuster circuit is configured to adjust a write data magnitude associated with the write data bit during a second portion of the write operation, the adjuster circuit further configured to apply the adjusted write data magnitude to the memory cell.

49. The computing device of claim 48, wherein the adjuster circuit is further configured to not adjust the write data magnitude when a read operation interrupts a write operation.

50. The computing device of claim 48, wherein the computing device is a personal computer.

51. The computing device of claim 48, wherein the computing device is a network element.

52. The computing device of claim 51, wherein the network element is a router.

53. The computing device of claim 48, wherein the memory cell is a TCCT-based memory cell.

54. A memory device comprising:
two or more thinly capacitively-coupled thyristor (TCCT) based memory cells connected to a word line two control line, where at least one of the two or more TCCT-based memory cell is selected to be programmed with a write data bit and at least another of the two or more TCCT-based memory cell is not selected to be programmed with the write data bit;
a bit line coupled to the at least one TCCT-based memory cell;
a TCCT-based reference memory cell configured to provide a reference signal;
an input/output line;
a cell select circuit coupled to the input/output line and configured to couple the bit line from the input/output line when the at least one TCCT-based memory cell is selected;
a sense amplifier circuit having a first input and a second input configured to receive the reference signal, where the first input is coupled to the bit line and is configured to receive a data bit from the input/output line; and
a write access circuit comprising
a transfer circuit coupled to the first sense amplifier input and configured to transfer the data bit during a first portion of the write operation;
a driver-register circuit including an input and an output, the input of the driver-register coupled to the transfer circuit to receive the data bit, where the driver-register circuit is configured to store the data bit and to drive the write data bit; and
an adjuster circuit coupled to the output of the driver-register circuit, where the adjuster circuit is configured to adjust a write data bit magnitude as determined by a semiconductor device characteristic during a second portion of the write operation.

55. The memory device of claim 54, wherein the semiconductor device characteristic is a threshold voltage.

56. The memory device of claim 54, wherein the memory device further comprises:
another bit line coupled to the at least another TCCT-based memory cell;
another sense amplifier having an input coupled to the another bit line;
another cell select circuit coupled to the input/output line and configured to isolate the another bit line from the input/output line;
another write access circuit coupled to each of the another bit line and the input of the another sense amplifier;
another TCCT-based reference memory cell configured to provide another reference signal that is used by the another sense amplifier to resolve another data bit magnitude representing another data bit into either the first logical state or the second logical state, where the resolved another data bit is transferred to the write access circuit.

57. A memory device comprising:
a memory cell configured to
store a data bit capable of representing a logical one or a logical zero, and
output a data signal with either
a first magnitude to indicate that the data bit is the logical one, or
a second magnitude to indicate that the data bit is the logical zero; and
a write access circuit coupled to the memory cell and configured to provide a write signal to program the data bit into the memory cell, the write signal having either
a third magnitude approximately equal to the first magnitude to program the memory cell with the data bit as the logical zero, or
a fourth magnitude to program the memory cell the data bit as the logical one, the fourth magnitude being between the first and second magnitudes.

58. The memory device of claim 57, wherein the memory cell is a TCCT-based memory cell.

59. The memory device of claim 57, wherein the fourth magnitude is more similar to the second magnitude than it is to the first magnitude.

60. The memory device of claim 57, wherein the first magnitude is approximately 1.2 V, the second magnitude is approximately 0.0 V, and the third magnitude is approximately 0.3 V.

61. A memory device for accessing a memory cell in performing a write operation, the method comprising:
means for preparing a data bit for programming a memory cell, the data bit having a data bit magnitude associated with a first logic state magnitude to represent a first logic state and a second logic state magnitude to represent a second logic state;
means for storing the data bit;
means for translating the data bit magnitude to a write data bit magnitude, where the write data magnitude is used to program the data bit into the memory cell; and
means for adjusting the write data bit magnitude associated with at least one of either the first logic state or the second logic state.

62. The memory device of claim 61, further comprising a means for reducing power consumed by the memory device.

63. The memory device of claim 61, wherein the means for reducing power further comprises a means for reducing a voltage drop across the memory cell in proportion with the adjusting of the write data bit magnitude.

64. The memory device of claim 61, further comprising a means for transmitting the stored data bit to an external source after a read operation interrupts the write operation.

* * * * *